US012592178B2

(12) United States Patent
Choi et al.

(10) Patent No.: US 12,592,178 B2
(45) Date of Patent: Mar. 31, 2026

(54) DISPLAY DEVICE INCLUDING AN ELECTROSTATIC DISCHARGE CIRCUIT FOR DISCHARGING STATIC ELECTRICITY

(71) Applicant: LG Display Co., Ltd., Seoul (KR)

(72) Inventors: WonJun Choi, Paju-si (KR); JinYeong Kim, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 161 days.

(21) Appl. No.: 18/397,082

(22) Filed: Dec. 27, 2023

(65) Prior Publication Data

US 2024/0290249 A1      Aug. 29, 2024

(30) Foreign Application Priority Data

Feb. 28, 2023     (KR) ........................ 10-2023-0027093

(51) Int. Cl.
| | |
|---|---|
| *G09G 3/32* | (2016.01) |
| *H01L 25/075* | (2006.01) |
| *H01L 25/16* | (2023.01) |
| *H10H 20/814* | (2025.01) |
| *H10H 20/857* | (2025.01) |

(52) U.S. Cl.
CPC ........... *G09G 3/32* (2013.01); *H01L 25/0753* (2013.01); *H01L 25/167* (2013.01); *H10H 20/814* (2025.01); *H10H 20/857* (2025.01); *G09G 2310/0267* (2013.01); *G09G 2330/06* (2013.01)

(58) Field of Classification Search
CPC ............. G09G 3/32; G09G 2310/0267; G09G 2330/06; H01L 25/0753; H01L 25/167; H01L 23/60; H10H 20/814; H10H 20/857; H10H 29/142; G09F 9/335; G09F 9/33; H10D 86/411; H10D 86/441; H10D 86/481

See application file for complete search history.

(56) References Cited

U.S. PATENT DOCUMENTS

| | | | | |
|---|---|---|---|---|
| 11,495,159 B2 * | 11/2022 | Yang | .................... | G09G 3/2003 |
| 2021/0167161 A1 * | 6/2021 | Yang | .................... | G09G 3/3275 |
| 2022/0037296 A1 * | 2/2022 | Yeon | .................... | G09F 9/3026 |
| 2022/0069058 A1 * | 3/2022 | Han | .................... | H10K 59/121 |
| 2022/0172673 A1 * | 6/2022 | Li | ............................ | G09G 3/32 |
| 2022/0254296 A1 * | 8/2022 | Li | ........................... | G07F 17/34 |
| 2022/0278173 A1 * | 9/2022 | Kong | .................... | H10K 59/38 |
| 2023/0049290 A1 * | 2/2023 | Park | .................... | H10K 50/80 |
| 2023/0343812 A1 * | 10/2023 | Zhang | ................. | H10K 59/121 |

FOREIGN PATENT DOCUMENTS

| | | | | | |
|---|---|---|---|---|---|
| CN | 113130536 A | * | 7/2021 | ........... | H10K 59/876 |
| CN | 113745264 A | * | 12/2021 | ............. | H10H 29/10 |

* cited by examiner

*Primary Examiner* — David D Davis
(74) *Attorney, Agent, or Firm* — Fenwick & West LLP

(57) ABSTRACT

A display device is disclosed. The display device includes a first substrate; a plurality of wiring lines that are on the first substrate and are connected to a plurality of data pads and a plurality of gate pads; and one pair of electrostatic discharge circuits connected to the plurality of wiring lines, respectively, one of the one pair of electrostatic discharge circuits is electrically connected to a plurality of high potential power lines and the other is electrically connected to a plurality of low potential power lines. Accordingly, one pair of electrostatic discharge circuits is connected to each of the plurality of wiring lines to easily protect the plurality of wiring lines from the static electricity.

22 Claims, 13 Drawing Sheets

DISPLAY DEVICE INCLUDING AN ELECTROSTATIC DISCHARGE CIRCUIT FOR DISCHARGING STATIC ELECTRICITY

CROSS-REFERENCE TO RELATED APPLICATION

This application claims the priority benefit of Republic of Korea Patent Application No. 10-2023-0027093 filed on Feb. 28, 2023, in the Korean Intellectual Property Office, which is hereby incorporated by reference in its entirety.

BACKGROUND

Field

The present disclosure relates to a display device, and more particularly, for example, without limitation, to a display device using a light emitting diode (LED).

Description of the Related Art

As display devices which are used for a monitor of a computer, a television, a cellular phone, or the like, there are an organic light emitting display (OLED) device which is a self-emitting device, a liquid crystal display (LCD) device which requires a separate light source, and the like.

An applicable range of the display device is diversified to personal digital assistants as well as monitors of computers and televisions and a display device with a large display area and a reduced volume and weight is being studied.

Further, recently, a display device including a light emitting diode (LED) is attracting attention as a next generation display device. Since the LED is formed of an inorganic material, rather than an organic material, reliability is excellent so that a lifespan thereof is longer than that of the liquid crystal display device or the organic light emitting display device. Further, the LED has a fast-lighting speed, excellent luminous efficiency, and a strong impact resistance so that a stability is excellent and an image having a high luminance can be displayed.

The description provided in the description of the related art section should not be assumed to be prior art merely because it is mentioned in or associated with the description of the related art section. The description of the related art section may include information that describes one or more aspects of the subject technology, and the description in this section does not limit the invention.

SUMMARY

The inventors have recognized requirements on the lighting speed, luminous efficiency, impact resistance and the like of the display device described above and limitations on static electricity effect. Accordingly, an object to be achieved by the present disclosure is to provide a display device which protects a display panel from a static electricity.

Another object to be achieved by the present disclosure is to provide a display device which easily discharges the static electricity entering an upper area and a lower area of the display panel.

Still another object to be achieved by the present disclosure is to provide a display device which protects a plurality of wiring lines from the static electricity.

Still another object to be achieved by the present disclosure is to provide a display device which minimizes or at least reduces occurrence of a short problem between wiring lines or a disconnection problem of a wiring line due to the static electricity.

Objects of the present disclosure are not limited to the above-mentioned objects, and other objects, which are not mentioned above, can be clearly understood by those skilled in the art from the following descriptions.

According to an aspect of the present disclosure, a display device includes a first substrate in which a plurality of pixel areas and a plurality of gate driving areas are defined; a plurality of first pad electrodes which is disposed on the first substrate and includes a plurality of data pads and a plurality of gate pads; a plurality of wiring lines which is disposed on the first substrate and is connected to the plurality of data pads and the plurality of gate pads; and one pair of electrostatic discharge circuits connected to the plurality of wiring lines, respectively, one of the pair of electrostatic discharge circuits is electrically connected to a plurality of high potential power lines and the other is electrically connected to a plurality of low potential power lines. Accordingly, one pair of electrostatic discharge circuits is connected to each of the plurality of wiring lines to easily protect the plurality of wiring lines from the static electricity.

Other detailed matters of the exemplary embodiments are included in the detailed description and the drawings.

According to the present disclosure, an electrostatic discharge circuit is formed to protect a display panel from static electricity.

According to the present disclosure, the static electricity which enters the display panel through a side surface of the display panel may be easily discharged.

According to the present disclosure, disconnection of a plurality of wiring lines or a short problem between a plurality of wiring lines caused by the static electricity may be minimized.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

Figure 1:
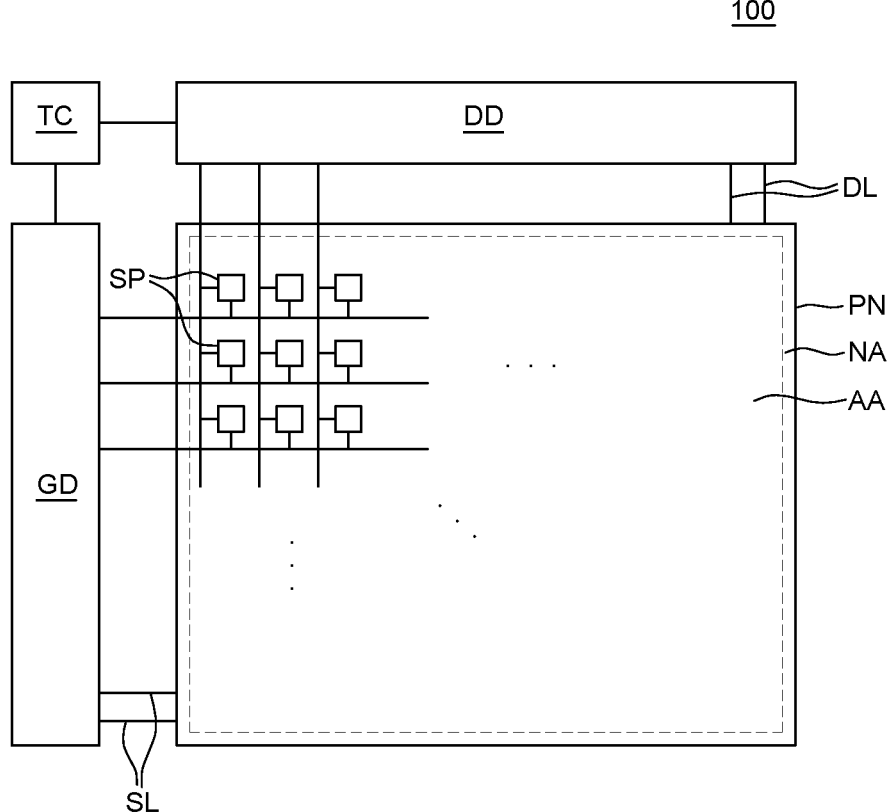
FIG. 1 is a schematic diagram of a display device according to an exemplary embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Further, the present disclosure is only defined by the scope of the claims and their equivalents.

The shapes, sizes, areas, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "include," "have," "comprise," "contain," "constitute," "make up of," and "formed of" used herein are generally intended to allow other components to be added unless the terms are used with the term such as "only". Any references to singular may include plural unless expressly stated otherwise.

Components are interpreted to include an ordinary error range or an ordinary tolerance range even if not expressly stated.

When the position relation between two parts is described using the terms such as "on", "above", "over", "below", "under", "beside", "beneath", "near", "close to", "adjacent to", "on a side of", "next" or the like, one or more parts may be positioned between the two parts unless the terms are used with the term such as "immediately" or "directly".

Spatially relative terms, such as "under," "below," "beneath", "lower," "over," "upper" and the like, may be used herein for ease of description to describe one element or feature's relationship to another element(s) or feature(s) as illustrated in the figures. It will be understood that the spatially relative terms can encompass different orientations of an element in use or operation in addition to the orientation depicted in the figures. For example, if an element in the figures is inverted, elements described as "below" or "beneath" other elements or features would then be oriented "over" the other elements or features. Thus, the exemplary term "below" can encompass both an orientation of below and above. Similarly, the exemplary term "above" or "over" can encompass both an orientation of "above" and "below".

In describing temporal relationship, terms such as "after," "subsequent to," "following," "next," "before," and the like may include cases where any two events are not consecutive, unless the term such as "immediately" "just" or "directly" is explicitly used.

When an element or layer is disposed "on" another element or layer, still another layer or still another element may be interposed directly on the other element or therebetween.

Although the terms "first", "second", "A", "B", "(a)", "(b)" and the like are used for describing various components, these components are not confined by these terms. These terms are merely used for distinguishing one component from the other components. Therefore, a first component to be mentioned below may be a second component in a technical concept of the present disclosure.

In addition, terms, such as first, second, A, B, (a), (b), or the like may be used herein when describing components of the present disclosure. Each of these terminologies is not used to define an essence, order, or sequence of a corresponding component but used merely to distinguish the corresponding component from other components. In the case that it is described that a certain structural element or layer is "connected", "coupled", "adhered" or "joined" to another structural element or layer, it is typically interpreted that another structural element or layer may be "connected", "coupled", "adhered" or "joined" to the structural element or layer directly or indirectly.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

A term "device" used herein may refer to a display device including a display panel and a driver for driving the display panel. Examples of the display device may include a light emitting diode (LED), and the like. In addition, examples of the device may include a notebook computer, a television, a computer monitor, an automotive device, a wearable device, and an automotive equipment device, and a set electronic device (or apparatus) or a set device (or apparatus), for example, a mobile electronic device such as a smartphone or an electronic pad, which are complete products or final products respectively including LED and the like, but embodiments of the present disclosure are not limited thereto.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning for example consistent with their meaning in the context of the relevant art and should not be interpreted in an idealized or overly formal sense unless expressly so defined herein.

In the aspects of the present disclosure, a source electrode and a drain electrode are distinguished from each other, for convenience of description. However, the source electrode and the drain electrode are used interchangeably. The source electrode may be the drain electrode, and the drain electrode may be the source electrode. Also, the source electrode in any one aspect of the present disclosure may be the drain electrode in another aspect of the present disclosure, and the drain electrode in any one aspect of the present disclosure may be the source electrode in another aspect of the present disclosure.

Hereinafter, a display device according to exemplary embodiments of the present disclosure will be described in detail with reference to accompanying drawings.

Figure 2A:
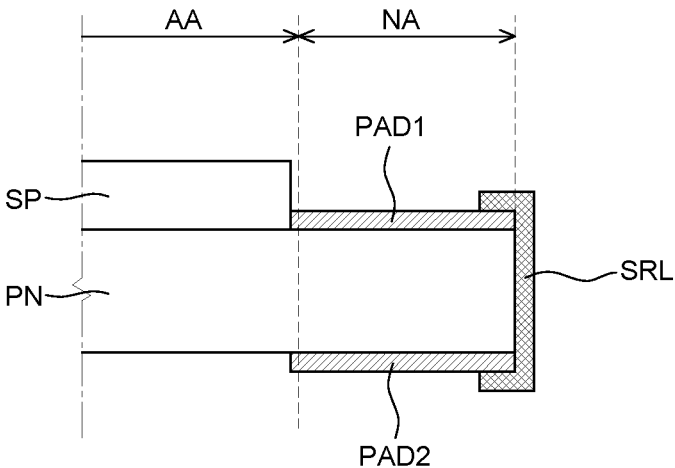
FIG. 2A is a partial cross-sectional view of a display device according to an exemplary embodiment of the present disclosure.
Figure 2B:
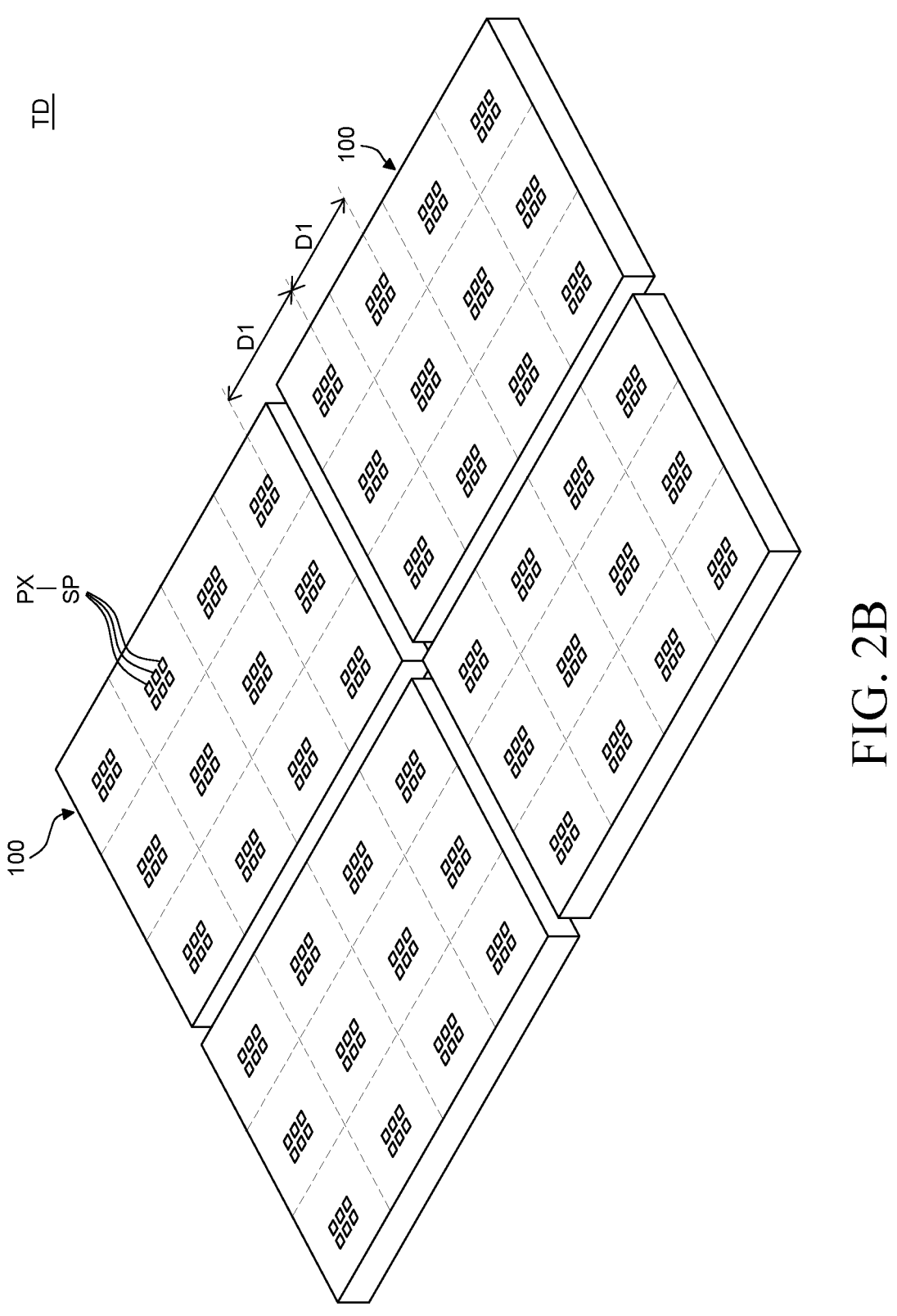
FIG. 2B is a perspective view of a tiling display device according to an exemplary embodiment of the present disclosure.

FIG. 1 is a schematic diagram of a display device according to an exemplary embodiment of the present disclosure. FIG. 2A is a partial cross-sectional view of a display device according to an exemplary embodiment of the present disclosure. FIG. 2B is a perspective view of a tiling display device according to an exemplary embodiment of the present disclosure. All the components of each display device according to all embodiments of the present disclosure are operatively coupled and configured. In FIG. 1, for the convenience of description, among various components of the display device 100, a display panel PN, a gate driver GD, a data driver DD, and a timing controller TC are illustrated.

Referring to FIG. 1, the display device 100 includes a display panel PN including a plurality of sub pixels SP, a gate driver GD and a data driver DD which supply various signals to the display panel PN, and a timing controller TC which controls the gate driver GD and the data driver DD.

The gate driver GD supplies a plurality of scan signals to a plurality of scan lines SL in accordance with a plurality of gate control signals supplied from the timing controller TC. Even though in FIG. 1, it is illustrated that one gate driver GD is disposed to be spaced apart from one side of the display panel PN, the number of the gate drivers GD and the placement thereof are not limited thereto, for example, the number of the gate drivers GD is two, and the two gate drivers GD are disposed at two sides of the display panel PN respectively and spaced apart from the display panel PN.

The data driver DD converts image data input from the timing controller TC into a data voltage using a reference gamma voltage in accordance with a plurality of data control signals supplied from the timing controller TC. The data driver DD may supply the converted data voltage to the plurality of data lines DL.

The timing controller TC aligns image data input from the outside to supply the image data to the data driver DD. The timing controller TC may generate a gate control signal and a data control signal using synchronization signals input from the outside, such as a dot clock signal, a data enable signal, and horizontal/vertical synchronization signals. Here, the horizontal synchronization signal is a signal representing a time taken to display one horizontal line of a screen and the vertical synchronization signal is a signal representing a time taken to display a screen of one frame. The data enable signal may correspond to a signal indicating a period for which a data voltage is supplied to the pixel PX. The timing controller TC supplies the generated gate control signal and data control signal to the gate driver GD and the data driver DD, respectively, to control the gate driver GD and the data driver DD.

The display panel PN is a configuration which displays images to the user and includes the plurality of sub pixels SP. In the display panel PN, the plurality of scan lines SL and the plurality of data lines DL intersect each other and the plurality of sub pixels SP is connected to the scan lines SL and the data lines DL, respectively. In addition, even though it is not illustrated in the drawing, each of the plurality of sub pixels SP may be connected to a high potential power line VL1, a low potential power line VL2, a reference line, and the like.

In the display panel PN, an active area AA and the non-active area NA disposed in the vicinity of the active area AA or surrounding the active area AA may be defined.

The active area AA is an area in which images are displayed in the display device 100. In the active area AA, a plurality of sub pixels SP which configures a plurality of pixels PX and a circuit for driving the plurality of sub pixels SP may be disposed. The plurality of sub pixels SP is a minimum unit which configures the active area AA and n sub pixels SP may form one pixel PX, where n is a positive integer. In each of the plurality of sub pixels SP, a light emitting diode 130, a thin film transistor TFT for driving the light emitting diode 130, and the like may be disposed. The plurality of light emitting diodes 130 may be defined in different ways depending on the type of the display panel PN. For example, when the display panel PN is an inorganic light emitting display panel PN, the light emitting diode 130 may be an inorganic light emitting diode (LED) or an inorganic micro light emitting diode (LED), and when the display panel PN is an organic light emitting display panel PN, the light emitting diode 130 may be an organic light emitting diode (OLED), but the embodiments of the present disclosure are not limited thereto.

In the active area AA, a plurality of wiring lines which transmits various signals to the plurality of sub pixels SP is disposed. For example, the plurality of wiring lines may include a plurality of data lines DL which supplies a data voltage to each of the plurality of sub pixels SP, a plurality of scan lines SL which supplies a scan signal to each of the plurality of sub pixels SP, and the like. The plurality of scan lines SL extends in one direction in the active area AA to be connected to the plurality of sub pixels SP and the plurality of data lines DL extends in a direction different from the one direction in the active area AA to be connected to the plurality of sub pixels SP. In addition, in the active area AA, a low potential power line VL2, a high potential power line VL1, and the like may be further disposed, but are not limited thereto.

The non-active area NA is an area where images are not displayed so that the non-active area NA may be defined as an area extending from the active area AA. In the non-active area NA, a link line which transmits a signal to the sub pixel SP of the active area AA, a pad electrode, or a driving IC, such as a gate driver IC or a data driver IC, may be disposed.

In the meantime, the non-active area NA may be located on a rear surface of the display panel PN, that is, a surface on which the sub pixels SP are not disposed or may be omitted, and is not limited as illustrated in the drawing.

In the meantime, a driver, such as a gate driver GD, a data driver DD, and a timing controller TC, may be connected to the display panel PN in various ways. For example, the gate driver GD may be mounted in the non-active area NA in a gate in panel (GIP) manner or mounted between the plurality of sub pixels SP in the active area AA in a gate in active area (GIA) manner. For example, the data driver DD and the timing controller TC are formed in separate flexible film and printed circuit board. The data driver DD and the timing controller TC may be electrically connected to the display panel PN by bonding the flexible film and the printed circuit board to the pad electrode formed in the non-active area NA of the display panel PN.

If the gate driver GD is mounted in the GIP manner and the data driver DD and the timing controller TC transmit a signal to the display panel PN through a pad electrode of the non-active area NA, an area of the non-active area NA for disposing the gate driver GD and the pad electrode is necessary more than a predetermined level. Accordingly, a bezel may be increased.

In contrast, when the gate driver GD is mounted in the active area AA in the GIA manner and a side line SRL which connects the signal line on the front surface of the display panel PN to the pad electrode on a rear surface of the display panel PN is formed to bond the flexible film and the printed circuit board onto a rear surface of the display panel PN, the non-active area NA may be minimized on the front surface of the display panel PN. That is, when the gate driver GD, the data driver DD, and the timing controller TC are connected to the display panel PN as described above, a zero bezel with substantially no bezel may be implemented.

Specifically, referring to FIGS. 2A and 2B, in the non-active area NA of the display panel PN, a plurality of pad electrodes for transmitting various signals to the plurality of sub pixels SP are disposed. For example, in the non-active area NA on the front surface of the display panel PN, a first pad electrode PAD1 which transmits a signal to the plurality of sub pixels SP is disposed. In the non-active area NA on the rear surface of the display panel PN, a second pad electrode PAD2 which is electrically connected to a driving component, such as a flexible film and the printed circuit board, is disposed. That is, on the front surface of the display panel PN on which images are displayed, a pad area of the non-active area NA in which the first pad electrode PAD1 is disposed may be formed at minimum.

In this case, even though it is not illustrated in the drawing, various signal lines connected to the plurality of sub pixels SP, for example, a scan line SL, a data line DL, or the like extend from the active area AA to the non-active area NA to be electrically connected to the first pad electrode PAD1.

The side line SRL is disposed along a side surface of the display panel PN. The side line SRL may electrically connect a first pad electrode PAD1 on the front surface of the display panel PN and a second pad electrode PAD2 on the rear surface of the display panel PN. Therefore, a signal from a driving component on the rear surface of the display panel PN may be transmitted to the plurality of sub pixels SP through the second pad electrode PAD2, the side line SRL, and the first pad electrode PAD1. Accordingly, a signal transmitting path from the front surface of the display panel PN to the side surface and the rear surface is formed to minimize an area of the non-active area NA on the front surface of the display panel PN.

Referring to FIG. 2B, a tiling display device TD having a large screen size may be implemented by connecting a plurality of display devices 100. At this time, as illustrated in FIG. 2B, when the tiling display device TD is implemented using a display device 100 with a minimized bezel, a seam area in which an image between the display devices 100 is not displayed is minimized so that a display quality may be improved.

For example, the plurality of sub pixels SP may form one pixel PX and a distance D1 between an outermost pixel PX of one display device 100 and an outermost pixel PX of another display device 100 adjacent to one display device may be implemented to be equal to a distance D1 between pixels PX in one display device 100. Accordingly, a distance D1 between pixels PX between the display devices 100 is constantly configured to minimize the seam area.

However, FIGS. 2A and 2B are illustrative so that the display device 100 according to the exemplary embodiment of the present disclosure may be a general display device 100 with a bezel, but is not limited thereto.

Figure 3:
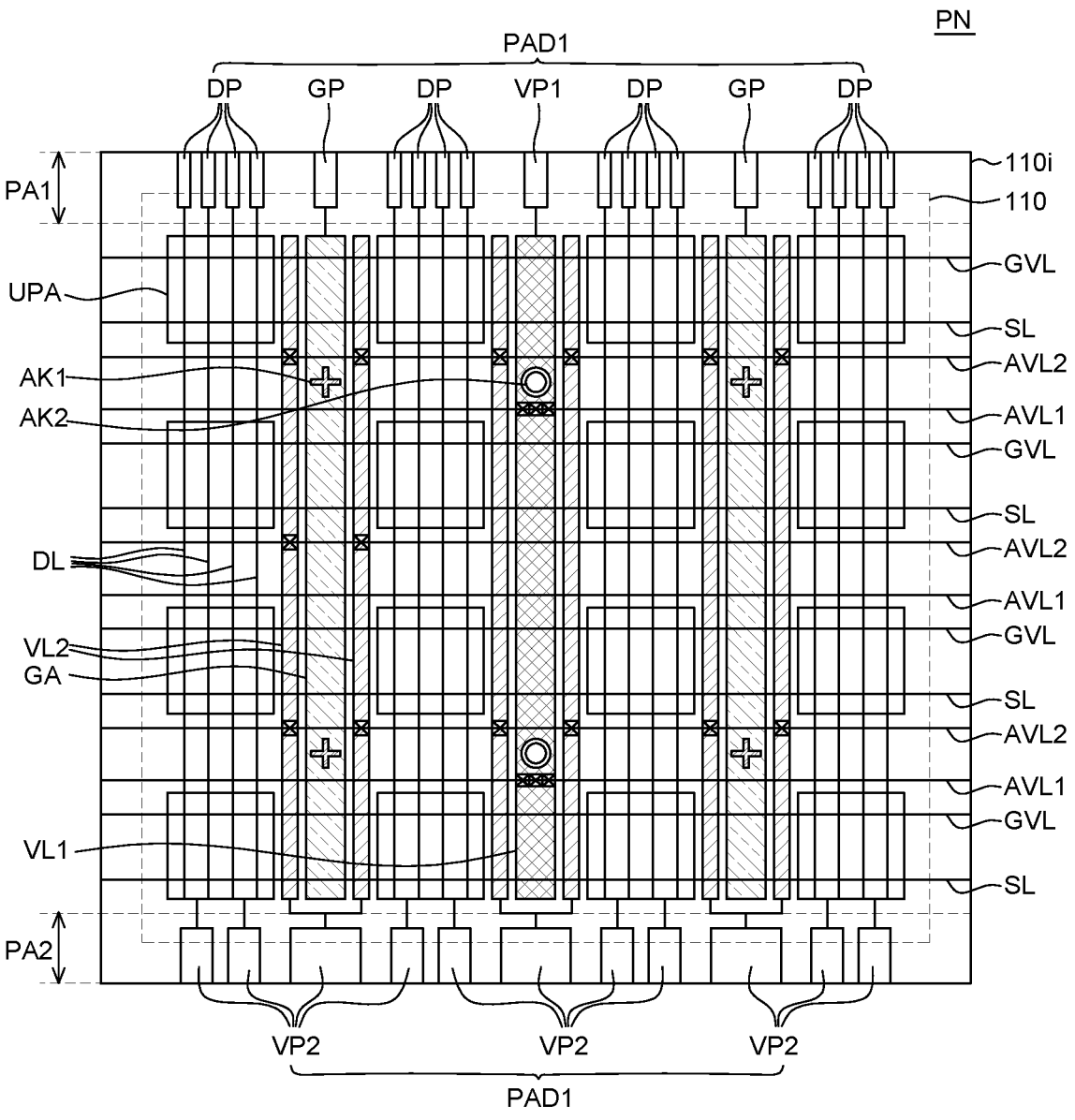
FIG. 3 is a plan view of a display panel of a display device according to an exemplary embodiment of the present disclosure.
Figure 4A:
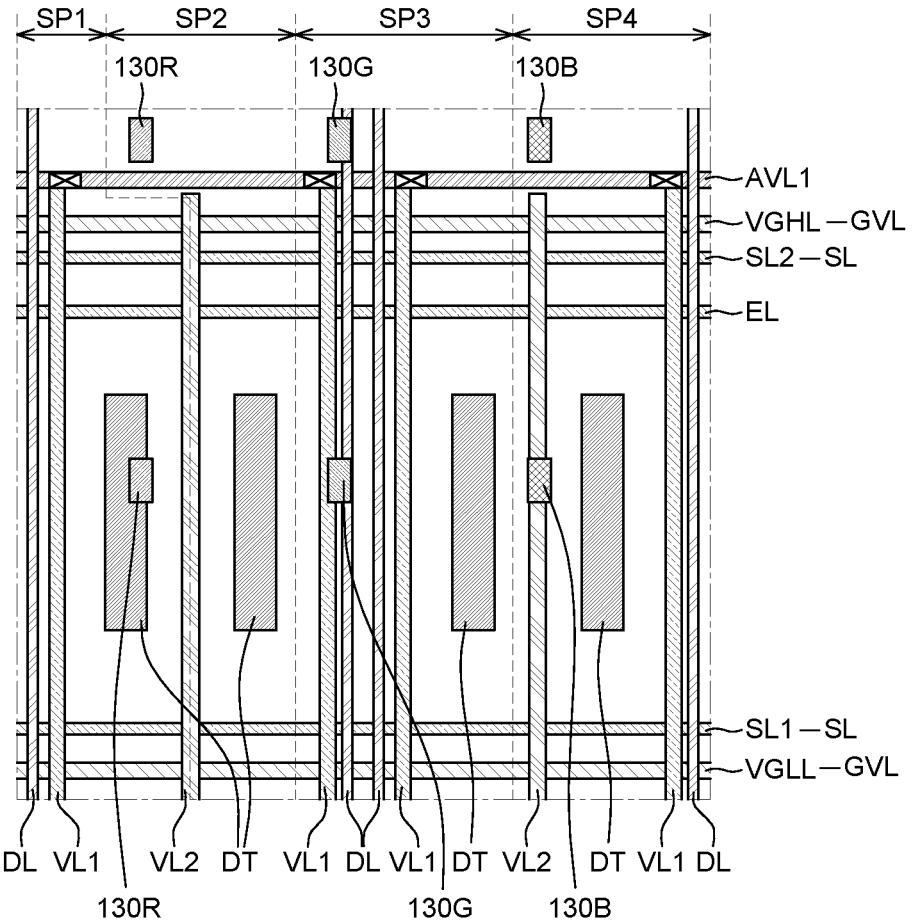
FIGS. 4A and 4B are plan views illustrating a pixel area of a display device according to an exemplary embodiment of the present disclosure.
Figure 4B:
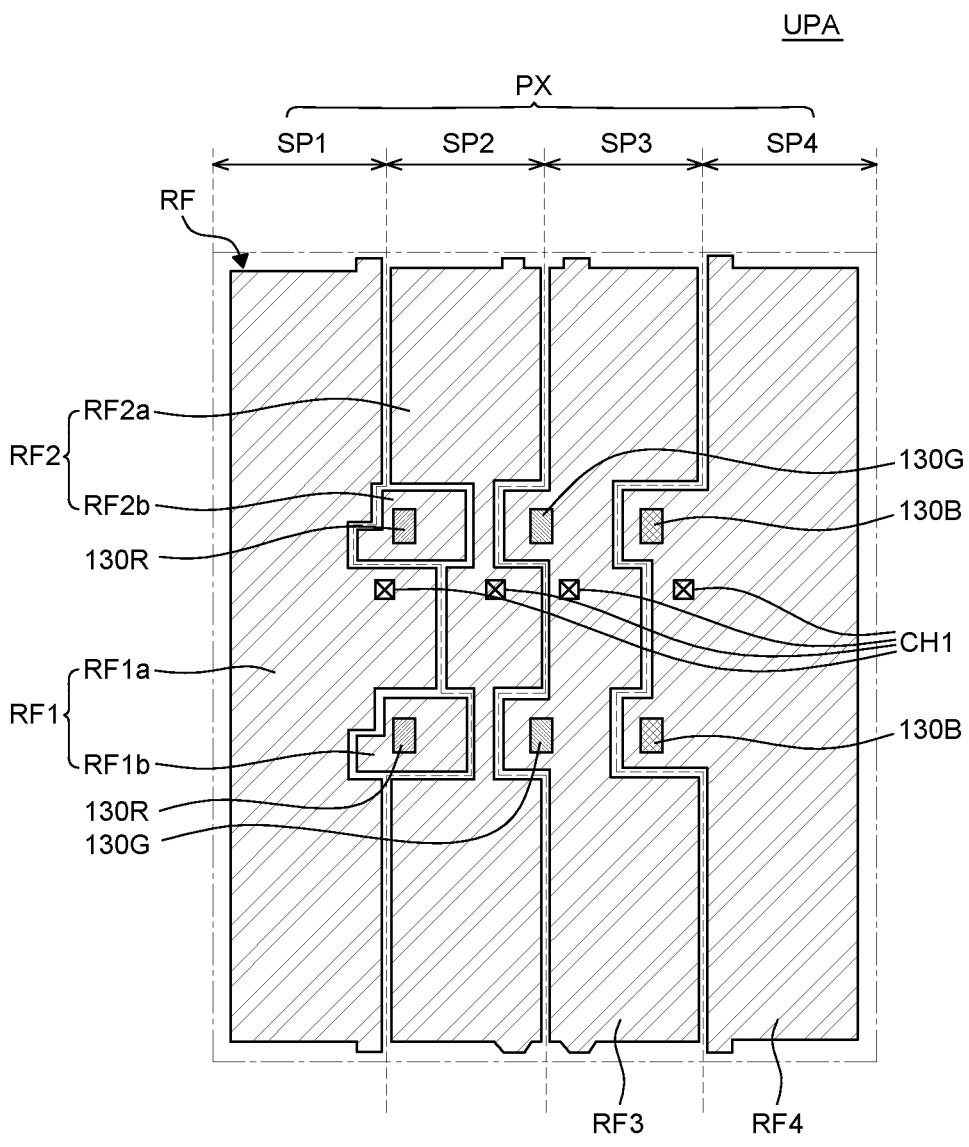
Figure 5:
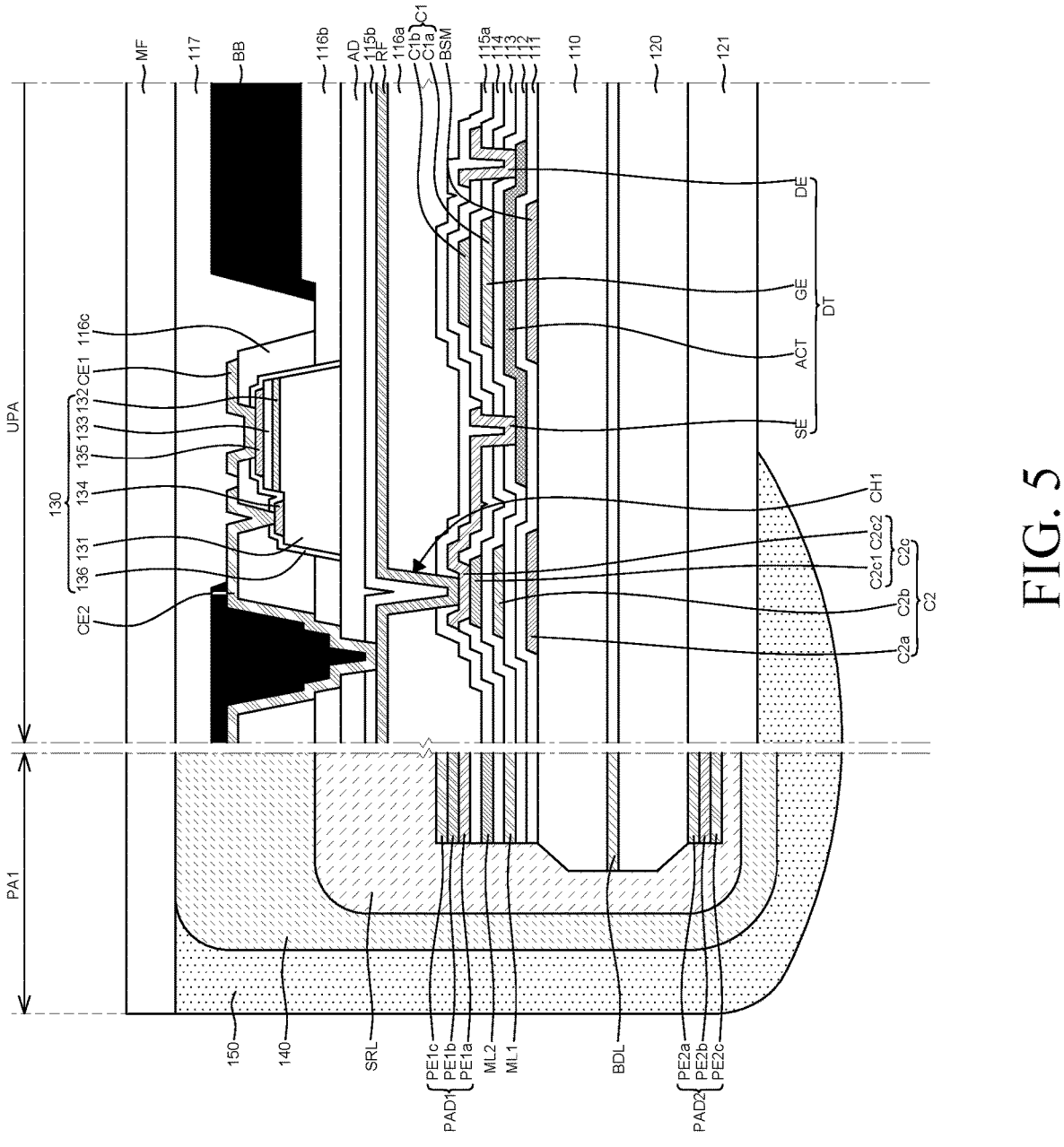
FIG. 5 is a cross-sectional view of a display device according to an exemplary embodiment of the present disclosure.

FIG. 3 is a plan view of a display panel of a display device according to an exemplary embodiment of the present disclosure. FIGS. 4A and 4B are plan views illustrating a pixel area of a display device according to an exemplary embodiment of the present disclosure. FIG. 5 is a cross-sectional view of a display device according to an exemplary embodiment of the present disclosure. For the convenience of description, in FIG. 4A, the plurality of light emitting diodes 130, a driving transistor DT of the pixel circuit, and a plurality of wiring lines are illustrated and in FIG. 4B, a plurality of reflection plates RF and a plurality of light emitting diodes 130 are illustrated, but embodiments of the present disclosure is not limited thereto.

First, referring to FIGS. 3 to 5, the display panel PN includes a first substrate 110. The first substrate 110 is a substrate which supports components disposed above the display device 100 and may be an insulating substrate. A plurality of pixels PX are formed on the first substrate 110 to display images. For example, the first substrate 110 may be formed of glass or resin. Further, the first substrate 110 may be formed of polymer or plastic. In some exemplary embodiments, the first substrate 110 may be formed of a plastic material having flexibility or a flexible polymer film. For example, the flexible polymer film may be made of any one of polyimide (PI), polyethylene terephthalate (PET), acrylonitrile-butadiene-styrene copolymer (ABS), polymethyl methacrylate (PMMA), polyethylene naphthalate (PEN), polycarbonate (PC), polyethersulfone (PES), polyarylate (PAR), polysulfone (PSF), cyclic olefin copolymer (COC), triacetylcellulose (TAC), polyvinyl alcohol (PVA), and polystyrene (PS), and the present disclosure is not limited thereto.

Referring to FIG. 3, in the first substrate 110, a plurality of pixel areas UPA, a plurality of gate driving areas GA, and a plurality of pad areas PA1 and PA2 are disposed. Among them, the plurality of pixel areas UPA and the plurality of gate driving areas GA may be included in the active area AA of the display panel PN.

First, the plurality of pixel areas UPA are areas in which the plurality of pixels PX is disposed. The plurality of pixel areas UPA may be disposed by forming a plurality of rows and a plurality of columns. Each of the plurality of pixels PX disposed in the plurality of pixel areas UPA includes a plurality of sub pixels SP. Each of the plurality of sub pixels SP includes a light emitting diode 130 and a pixel circuit to independently emit light.

The plurality of gate driving areas GA are areas where gate drivers GD are disposed. The gate driver GD may be mounted in the active area AA in a gate in active area (GIA) manner. For example, the gate driving area GA may be formed along a row direction and/or column direction between the plurality of pixel areas UPA. The gate driver GD formed in the gate driving area GA may supply the scan signal to the plurality of scan lines SL.

The gate driver GD disposed in the gate driving area GA may include a circuit for outputting a scan signal. For example, the gate driver may include a plurality of gate driving transistors and/or capacitors, like the pixel circuit. Here, active layers of the plurality of gate driving transistors may be formed of a semiconductor material, such as an oxide semiconductor material, amorphous semiconductor material, polycrystalline semiconductor material, or organic semiconductor material, but are not limited thereto.

The oxide semiconductor material may have an excellent effect of preventing or at least reducing a leakage current and relatively inexpensive manufacturing cost. The oxide semiconductor may be made of a metal oxide such as zinc (Zn), indium (In), gallium (Ga), tin (Sn), and titanium (Ti) or a combination of a metal such as zinc (Zn), indium (In), gallium (Ga), tin (Sn), or titanium (Ti) and its oxide. Specifically, the oxide semiconductor may include zinc oxide (ZnO), zinc-tin oxide (ZTO), zinc-indium oxide (ZIO), indium oxide (InO), titanium oxide (TiO), indium-gallium-zinc oxide (IGZO), indium-zinc-tin oxide (IZTO), indium zinc oxide (IZO), indium gallium tin oxide (IGTO), and indium gallium oxide (IGO), but is not limited thereto.

The polycrystalline semiconductor material has a fast movement speed of carriers such as electrons and holes and thus has high mobility, and has low energy power consumption and superior reliability. The polycrystalline semiconductor may be made of polycrystalline silicon (poly-Si), but is not limited thereto.

The amorphous semiconductor material may be made of amorphous silicon (a-Si), but is not limited thereto.

The organic semiconductor material may include metal-organic compounds, but is not limited thereto.

The active layers of the plurality of gate driving transistors may be formed of the same material or different materials from each other. Further, the active layers of the plurality of gate driving transistors of the gate driver may be formed of the same material as active layers of various transistors of the pixel circuit or formed of different materials from each other.

The plurality of pad areas PA1 and PA2 are areas in which a plurality of first pad electrodes PAD1 is disposed. The plurality of first pad electrodes PAD1 may transmit various signals to various wiring lines extending in a column direction in the active area AA. For example, the plurality of first pad electrodes PAD1 includes a data pad DP, a gate pad GP, a high potential power pad VP1, and a low potential power pad VP2. The data pad DP transmits a data voltage to the data line DL and the gate pad GP transmits a clock signal, a start signal, a gate low voltage, and a gate high voltage for driving the gate driver GD to the gate driver GD. The high potential power pad VP1 transmits a high potential power voltage to the high potential power line VL1 and the low potential power pad VP2 transmits a low potential power voltage to the low potential power line VL2.

The plurality of pad areas PA1 and PA2 includes a first pad area PA1 located at an upper edge of the display panel PN and a second pad area PA2 located at a lower edge of the display panel PN. At this time, in the first pad area PA1 and the second pad area PA2, different types of first pad electrodes PAD1 may be disposed. For example, in the first pad area PA1, among the plurality of first pad electrodes PAD1, the data pad DP, the gate pad GP, and the high potential power pad VP1 may be disposed. In the second pad area PA2, the low potential power pad VP2 may be disposed.

At this time, the plurality of first pad electrodes PAD1 may be formed to have different sizes. For example, the plurality of data pads DP which are connected to the plurality of data lines DL one to one may have a relatively narrower width and the high potential power pad VP1, the low potential power pad VP2, and the gate pad GP may have a relatively larger width. For example, the width of each of the high potential power pad VP1, the low potential power pad VP2, and the gate pad GP is greater than the width of each of the plurality of data pads DP. However, widths of the data pad DP, the gate pad GP, the high potential power pad VP1, and the low potential power pad VP2 illustrated in FIG. 3 are illustrative so that the first pad electrode PAD1 may be configured in various sizes, but is not limited thereto.

In the meantime, in order to reduce the bezel of the display panel PN, an edge of the display panel PN may be cut to be removed. The plurality of pixels PX, the plurality of wiring lines, and the plurality of first pad electrodes PAD1 are formed on an initial first substrate 110$i$ and an edge part of the initial first substrate 110$i$ is ground to reduce the bezel area. During the grinding process, a part of the initial first substrate 110$i$ is removed to form a first substrate 110 with a smaller size. At this time, parts of the plurality of first pad electrodes PAD1 and wiring lines disposed at the edge of the first substrate 110 may be removed. Accordingly, only a part of the plurality of first pad electrodes PAD1 may remain on the first substrate 110.

Next, the plurality of data lines DL which extends in a column direction from the plurality of first pad electrodes PAD1 are disposed on the first substrate 110 of the display panel PN. The plurality of data lines DL may extend from the plurality of data pads DP of the first pad area PA1 toward the plurality of pixel areas UPA. The plurality of data lines DL may extend in a column direction and overlap the plurality of pixel areas UPA. Therefore, the plurality of data lines DL may transmit the data voltage to the pixel circuit of each of the plurality of sub pixels SP.

The plurality of high potential power lines VL1 extending in the column direction are disposed on the first substrate 110 of the display panel PN. Some of the plurality of high potential power lines VL1 extends from the high potential power pad VP1 of the first pad area PA1 to the plurality of pixel areas UPA to transmit the high potential power voltage to the light emitting diodes 130 of the plurality of sub pixels SP, respectively. The others of the plurality of high potential power lines VL1 may be electrically connected to the other high potential power line VL1 by means of an auxiliary high potential power line AVL1 to be described below. In FIG. 3, for the convenience of description, even though it is illustrated that one high potential power line VL1 and one high potential power pad VP1 are disposed, a plurality of high potential power lines VL1 and high potential power pads VP1 may be disposed.

The plurality of low potential power lines VL2 extending in the column direction are disposed on the first substrate 110 of the display panel PN. At least some of the plurality of low potential power lines VL2 extends from the low potential power pad VP2 of the second pad area PA2 to the plurality of pixel areas UPA to transmit the low potential power voltage to the pixel circuit of each of the plurality of sub pixels SP. The others of the plurality of low potential power lines VL2 may be electrically connected to the other low potential power line VL2 by means of an auxiliary low potential power line AVL2 to be described below.

The plurality of scan lines SL extending in the row direction are disposed on the first substrate 110 of the display panel PN. The plurality of scan lines SL extends in the row direction and may be disposed across the plurality of pixel areas UPA and the plurality of gate driving areas GA. The plurality of scan lines SL may transmit the scan signal from the gate driver GD to the pixel circuits of the plurality of sub pixels SP.

A plurality of auxiliary high potential power lines AVL1 extending in the row direction are disposed on the first substrate 110 of the display panel PN. The plurality of auxiliary high potential power lines AVL1 may be disposed in an area between the plurality of pixel areas UPA. The plurality of auxiliary high potential power lines AVL1 extending in the row direction are electrically connected to the plurality of high potential power lines VL1 extending in the column direction through a contact hole. The plurality of auxiliary high potential power lines AVL1 and the plurality of high potential power lines VL1 may form a mesh structure. Therefore, the plurality of auxiliary high potential power lines AVL1 and the plurality of high potential power lines VL1 are configured to form a mesh structure to minimize or at least reduce voltage drop and voltage deviation.

A plurality of auxiliary low potential power lines AVL2 extending in the row direction are disposed on the first substrate 110 of the display panel PN. The plurality of auxiliary low potential power lines AVL2 may be disposed in an area between the plurality of pixel areas UPA. The plurality of auxiliary low potential power lines AVL2 extending in the row direction are electrically connected to the plurality of low potential power lines VL2 extending in the column direction through a contact hole. The plurality of auxiliary low potential power lines AVL2 and the plurality of low potential power lines VL2 may form a mesh structure. Therefore, the plurality of auxiliary low potential power lines AVL2 and the plurality of low potential power lines VL2 are configured to form a mesh structure to reduce a resistance of the wiring line and minimize voltage deviation.

Referring to FIGS. 3 and 4A, the plurality of gate driving lines GVL extending in the row direction and the column direction is disposed on the first substrate 110 of the display panel PN. Some of the plurality of gate driving lines GVL extends from the gate pad GP of the first pad area PA1 to the gate driving area GA to transmit a signal to the gate driver GD. The others of the plurality of gate driving lines GVL may extend in the row direction and transmit the signal to the gate drivers GD of the plurality of gate driving areas GA. Therefore, various signals are transmitted from the gate driving line GVL to the gate driver GD to drive the gate driver GD.

The plurality of gate driving lines GVL may include wiring lines which transmit a clock signal, a start signal, a gate high voltage, and a gate low voltage to the gate driver GD. Therefore, various signals are transmitted from the gate driving line GVL to the gate driver GD to drive the gate driver GD.

For example, referring to FIG. 4A, the plurality of gate driving lines GVL may include a gate power line which transmits a power voltage to the gate driver GD of the gate driving area GA. The plurality of gate power lines includes a first gate power line VGHL-GVL which transmits a gate high voltage to the gate driver GD and a second gate power line VGLL-GVL which transmits a gate low voltage to the gate driver GD.

A plurality of alignment keys are disposed in an area between the plurality of pixel areas UPA in the display panel PN. The plurality of alignment keys are used for alignment during the manufacturing process of the display panel PN. The plurality of alignment keys include a first alignment key AK1 and a second alignment key AK2.

The first alignment key AK1 may be disposed in the gate driving area GA between the plurality of pixel areas UPA. The first alignment key AK1 may be used to inspect an alignment position of the plurality of light emitting diodes 130. For example, the first alignment key AK1 may have a cross shape, but is not limited thereto.

The second alignment key AK2 may be disposed to overlap the high potential power line VL1 between the plurality of pixel areas UPA. In the high potential power line VL1, a hole overlapping the second alignment key AK2 is formed to divide the second alignment key AK2 and the high potential power line VL1. The second alignment key AK2 may be used to align the display panel PN and a donor. The display panel PN and the donor are aligned using the second alignment key AK2 and the plurality of light emitting diodes 130 of the donor may be transferred onto the display panel PN. For example, the second alignment key AK2 may have a circular ring shape, but is not limited thereto.

Hereinafter, the plurality of sub pixels SP of the pixel area UPA will be described in more detail with reference to FIG. 4A, FIGS. 4B and 5.

Referring to FIGS. 4A and 4B, in one pixel area UPA, a plurality of sub pixels SP which forms one pixel PX are disposed. The sub pixel SP is a minimum unit which configures a screen and each of the plurality of sub pixels SP may emit light having different wavelengths from each other. For example, the plurality of sub pixels SP may include a first sub pixel SP1, a second sub pixel SP2, a third sub pixel SP3, and a fourth sub pixel SP4 which emit different color light. For example, the first sub pixel SP1 and the second sub pixel SP2 may be red sub pixels, the third sub pixel SP3 may be a green sub pixel, and the fourth sub pixel SP4 may be a blue sub pixel, but it is not limited thereto.

Alternatively, the plurality of sub pixels SP may include a red sub pixel SPR which is a first sub pixel, a green sub pixel SPG which is a second sub pixel, and a blue sub pixel SPB which is a third sub pixel. Alternatively, the plurality of sub pixels SP may also further include a white sub pixel. For example, the plurality of sub pixels SP may include red, green, and blue sub-pixels, in which the red, green, and blue sub-pixels may be disposed in a repeated manner. Alternatively, the plurality of sub pixels SP may include red, green, blue, and white sub-pixels, in which the red, green, blue, and white sub-pixels may be disposed in a repeated manner, or the red, green, blue, and white sub-pixels may be disposed in a quad type. For example, the red sub pixel, the blue sub pixel, and the green sub pixel may be sequentially disposed along a row direction, or the red sub pixel, the blue sub pixel, the green sub pixel and the white sub pixel may be sequentially disposed along the row direction.

However, in the exemplary embodiment of the present disclosure, the color type, disposition type, and disposition order of the sub-pixels are not limiting, and may be configured in various forms according to light-emitting characteristics, device lifespans, and device specifications.

Meanwhile, the sub-pixels may have different light-emitting areas according to light-emitting characteristics. For example, a sub-pixel that emits light of a color different from that of a blue sub-pixel may have a different light-emitting area from that of the blue sub-pixel. For example, the red sub-pixel, the blue sub-pixel, and the green sub-pixel, or the red sub-pixel, the blue sub-pixel, the white sub-pixel, and the green sub-pixel may each has a different light-emitting area.

Hereinafter, the description will be made by assuming that one-pixel PX includes one first sub pixel SP1, one second sub pixel SP2, one third sub pixel SP3, and one fourth sub pixel SP4, that is, two red sub pixels, one green sub pixel, and one blue sub pixel. However, the configuration of the pixel PX is not limited thereto.

Referring to FIG. 4A, as described above, a plurality of wiring lines which supplies various signals to the plurality of sub pixels SP are disposed in the plurality of pixel areas UPA of the first substrate 110. For example, the plurality of data lines DL, the plurality of high potential power lines VL1, and the plurality of low potential power lines VL2 extending in the column direction may be disposed on the first substrate 110. For example, the plurality of emission control signal lines EL, the plurality of auxiliary high potential power lines AVL1, the plurality of auxiliary low potential power lines AVL2, the plurality of first scan lines SL1, and the plurality of second scan lines SL2 extending in the row direction may be disposed on the first substrate 110. The high potential power line VL1 extending in the column direction may be electrically connected to the auxiliary high potential power line AVL1 extending in the row direction through a contact hole. At this time, the emission control signal line EL transmits an emission control signal to the pixel circuits of the plurality of sub pixels SP to control emission timings of the plurality of sub pixels SP, respectively.

Some gate driving lines GVL which transmit signals to the plurality of gate drivers GD disposed to be spaced apart from each other with the pixel area UPA therebetween may be disposed across the pixel area UPA while extending in the row direction. For example, a first gate power line VGHL which supplies a gate high voltage to the gate driver GD and a second gate power line VGLL which supplies a gate low voltage may be disposed across the pixel area UPA.

In the meantime, even though it is illustrated that the plurality of scan lines SL includes a first scan line SL1 and a second scan line SL2, the configuration of the plurality of scan lines SL may vary depending on the pixel circuit configuration of the sub pixel SP, but is not limited thereto, for example, the plurality of scan lines SL includes n scan lines, where n is a positive integer.

The pixel circuit for driving the light emitting diode 130 is disposed in each of the plurality of sub pixels SP on the first substrate 110. The pixel circuit may include a plurality of transistors and a plurality of capacitors. In FIGS. 4A and 5, for the convenience of description, a driving transistor DT, a first capacitor C1, and a second capacitor C2, among configurations of the pixel circuit are illustrated. However, the pixel circuit may further include a switching transistor, a sensing transistor, an emission control transistor, and the like, but is not limited thereto. In the pixel circuit of the present disclosure, various configurations of internal compensation circuits are possible. For example, a number of transistors TFTs in the pixel circuit of the present disclosure may be three or more, and a number of capacitor may be one or more, for example, the pixel circuit of the present disclosure may be a 3T1C pixel circuit including three TFTs and one capacitor, a 3T2C pixel circuit including three TFTs and two capacitors, a 5T1C pixel circuit including five TFTs and one capacitor, a 5T2C pixel circuit including five TFTs and two capacitors, a 7T2C pixel circuit including seven TFTs and two capacitors, or the like.

First, a light shielding layer BSM is disposed on the first substrate 110. The light shielding layer BSM blocks light which is incident to an active layer ACT of the plurality of transistors to minimize or at least reduce a leakage current. For example, the light shielding layer BSM is disposed below the active layer ACT of the driving transistor DT to block light incident onto the active layer ACT. If light is irradiated onto the active layer ACT, leakage current is generated, which may deteriorate the reliability of the transistor. Accordingly, the light shielding layer BSM which blocks the light is disposed on the first substrate 110 to improve the reliability of the driving transistor DT. The light shielding layer BSM may be configured by an opaque conductive material such as copper (Cu), aluminum (Al), molybdenum (Mo), nickel (Ni), titanium (Ti), chrome (Cr), or an alloy thereof, but is not limited thereto.

A buffer layer 111 is disposed on the light shielding layer BSM. The buffer layer 111 may reduce permeation of moisture or impurities through the first substrate 110. The buffer layer 111 may be configured by a single layer, double layers or more layers of silicon oxide SiOx or silicon nitride SiNx, but is not limited thereto. For example, the buffer layer 111 may be formed by inorganic film in a single layer or in multiple layers, for example, the inorganic film in a single layer may be a silicon oxide (SiOx) film or a silicon nitride (SiNx) film, and inorganic films in multiple layers may formed by alternately stacking one or more silicon oxide (SiOx) films, one or more silicon nitride (SiNx) films, and one or more amorphous silicon (a-Si), but the present disclosure is not limited thereto. However, the buffer layer 111 may be omitted depending on a type of the first substrate 110 or a type of the thin film transistor, but is not limited thereto.

A driving transistor DT includes an active layer ACT, a gate electrode GE, a source electrode SE, and a drain electrode DE. The driving transistor DT is disposed on the buffer layer 111.

First, the active layer ACT of the driving transistor DT is disposed on the buffer layer 111. The active layer ACT may be formed of a semiconductor material such as an oxide semiconductor, amorphous silicon, polysilicon or metalorganic compounds, but is not limited thereto. Further, even though it is not illustrated in the drawings, other transistors, such as a switching transistor, a sensing transistor, and an emission control transistor, other than the driving transistor DT, may be further disposed on the buffer layer 111. The active layers of the other transistors may be also formed of a semiconductor material, such as an oxide semiconductor, amorphous silicon, polysilicon, or metal-organic compounds, but are not limited thereto. The active layer of the transistor included in the pixel circuit, such as the driving transistor DT, the switching transistor, the sensing transistor, and the emission control transistor, may be formed of the same material, or formed of different materials.

The gate insulating layer 112 is disposed on the active layer ACT. The gate insulating layer 112 is an insulating layer which electrically insulates the active layer ACT from the gate electrode GE. The gate insulating layer 112 may be configured by a single layer, double layers or more layers of silicon oxide SiOx or silicon nitride SiNx, but is not limited thereto. For example, the gate insulating layer 112 may be formed by inorganic film in a single layer or in multiple layers, for example, the inorganic film in a single layer may be a silicon oxide (SiOx) film or a silicon nitride (SiNx) film, and inorganic films in multiple layers may formed by alternately stacking one or more silicon oxide (SiOx) films, one or more silicon nitride (SiNx) films, and one or more amorphous silicon (a-Si), but the present disclosure is not limited thereto.

The gate electrode GE is disposed on the gate insulating layer 112. The gate electrode GE may be configured by a conductive material, such as copper (Cu), aluminum (Al), molybdenum (Mo), nickel (Ni), titanium (Ti), chrome (Cr), or an alloy thereof, but is not limited thereto.

A first interlayer insulating layer 113 and a second interlayer insulating layer 114 are disposed on the gate electrode GE. In the first interlayer insulating layer 113 and the second interlayer insulating layer 114, contact holes through which the source electrode SE and the drain electrode DE are each connected to the active layer ACT are formed. The first interlayer insulating layer 113 and the second interlayer insulating layer 114 are insulating layers which protect components there below and may be configured by a single layer, double layers or more layers of silicon oxide SiOx or silicon nitride SiNx, but is not limited thereto. For example, each of the first interlayer insulating layer 113 and the second interlayer insulating layer 114 may be formed by inorganic film in a single layer or in multiple layers, for example, the inorganic film in a single layer may be a silicon oxide (SiOx) film or a silicon nitride (SiNx) film, and inorganic films in multiple layers may formed by alternately stacking one or more silicon oxide (SiOx) films, one or more silicon nitride (SiNx) films, and one or more amorphous silicon (a-Si), but the present disclosure is not limited thereto.

The source electrode SE and the drain electrode DE which are electrically connected to the active layer ACT are disposed on the second interlayer insulating layer 114. The source electrode SE is electrically connected to the second capacitor C2 and the first electrode 134 of the light emitting diode 130 and the drain electrode DE is electrically connected to the other configuration of the pixel circuit. The source electrode SE and the drain electrode DE may be configured by a conductive material, such as copper (Cu), aluminum (Al), molybdenum (Mo), nickel (Ni), titanium (Ti), chrome (Cr), or an alloy thereof, but are not limited thereto.

Next, the first capacitor C1 is disposed on the gate insulating layer 112. The first capacitor C1 includes a 1-1-th capacitor electrode C1a and a 1-2-th capacitor electrode C1b.

First, the 1-1-th capacitor electrode C1a is disposed on the gate insulating layer 112. The 1-1-th capacitor electrode C1a may be integrally formed with the gate electrode GE of the driving transistor DT.

The 1-2-th capacitor electrode C1b is disposed on the first interlayer insulating layer 113. The 1-2-th capacitor electrode C1b is disposed to overlap the 1-1-th capacitor electrode C1a with the first interlayer insulating layer 113 therebetween.

Therefore, the first capacitor C1 is connected to the gate electrode GE of the driving transistor DT to maintain a voltage of the gate electrode GE of the driving transistor DT for a predetermined period.

Next, the second capacitor C2 is disposed on the first substrate 110. The second capacitor C2 includes a 2-1-th capacitor electrode C2a, a 2-2-th capacitor electrode C2b, and a 2-3-th capacitor electrode C2c. The second capacitor C2 includes the 2-1-th capacitor electrode C2a which is a lower capacitor electrode, the 2-2-th capacitor electrode C2b which is an intermediate capacitor electrode, and the 2-3-th capacitor electrode C2c which is an upper capacitor electrode.

The 2-1-th capacitor electrode C2a is disposed on the first substrate 110. The 2-1-th capacitor electrode C2a is disposed on the same layer as the light shielding layer BSM and may be formed of the same material.

The 2-2-th capacitor electrode C2b is disposed on the buffer layer 111 and the gate insulating layer 112. The 2-2-th capacitor electrode C2b is disposed on the same layer as the gate electrode GE and may be formed of the same material.

The 2-3-th capacitor electrode C2c is disposed on the first interlayer insulating layer 113. The 2-3-th capacitor electrode C2c may be configured by a first layer C2c1 and a second layer C2c2. The first layer C2c1 of the 2-3-th capacitor electrode C2c may be formed on the same layer as the 1-2-th capacitor electrode C1b with the same material. The first layer C2c1 may be disposed to overlap the 2-1-th capacitor electrode C2a and the 2-2-th capacitor electrode C2b with the first interlayer insulating layer 113 therebetween, for example, the first interlayer insulating layer 113 is disposed between first layer C2c1 of the 2-3-th capacitor electrode C2c and the 2-2-th capacitor electrode C2b.

The second layer C2c2 of the 2-3-th capacitor electrode C2c is disposed on the second interlayer insulating layer 114. The second layer C2c2 is a part extending from the source electrode SE of the driving transistor DT and may be connected to the first layer C2c1 through the contact hole of the second interlayer insulating layer 114.

Accordingly, the second capacitor C2 is electrically connected between the source electrode SE of the driving transistor DT and the light emitting diode 130 to increase capacitance inherent in the light emitting diode 130 and allow the light emitting diode 130 to emit light with a higher luminance.

A first passivation layer 115a is disposed on the driving transistor DT, the first capacitor C1, and the second capacitor C2. The first passivation layer 115a is an insulating layer which protects components below the first passivation layer 115a and may be configured by an inorganic material, such as silicon oxide SiOx or silicon nitride SiNx, but is not limited thereto. For example, the first passivation layer 115a may be formed by inorganic film in a single layer or in multiple layers, for example, the inorganic film in a single layer may be a silicon oxide (SiOx) film or a silicon nitride (SiNx) film, and inorganic films in multiple layers may formed by alternately stacking one or more silicon oxide (SiOx) films, one or more silicon nitride (SiNx) films, and one or more amorphous silicon (a-Si), but the present disclosure is not limited thereto.

A first planarization layer 116a is disposed on the first passivation layer 115a. The first planarization layer 116a may planarize an upper portion of the pixel circuit including the driving transistor DT. The first planarization layer 116a may be configured by a single layer, double layers or more layers, and for example, configured by benzocyclobutene or an acrylic organic material, but is not limited thereto.

Referring to FIGS. 4B and 5 together, a plurality of reflection plates RF are disposed on the first planarization layer 116a. The reflection plate RF is a configuration which reflects light emitted from the plurality of light emitting diodes 130 above the first substrate 110 and may be formed with a shape corresponding to each of the plurality of sub pixels SP. One reflection plate RF may be disposed to cover the most area of one sub pixel SP. The reflection plate RF reflects the light emitted from the light emitting diode 130 and may be also used as an electrode which electrically connects the light emitting diode 130 and the pixel circuit. Therefore, the reflection plate RF may include various conductive layers in consideration of a light reflection efficiency and a resistance. For example, the reflection plate RF may use an opaque conductive layer such as silver (Ag), aluminum (Al), molybdenum (Mo), titanium (Ti), or an alloy thereof and a transparent conductive layer such as indium tin oxide (ITO), but the structure of the reflection plate RF is not limited thereto.

The reflection plate RF includes a first reflection plate RF1 corresponding to the first sub pixel SP1, a second reflection plate RF2 corresponding to the second sub pixel SP2, a third reflection plate RF3 corresponding to the third sub pixel SP3, and a fourth reflection plate RF4 corresponding to the fourth sub pixel SP4.

The first reflection plate RF1 includes a 1-1-th reflection plate RF1a overlapping most of the first sub pixel SP1 and a 1-2-th reflection plate RF1b overlapping the red light emitting diode 130R of the first sub pixel SP1. The 1-1-th reflection plate RF1a may reflect light emitted from the red light emitting diode 130R above the red light emitting diode 130R. The 1-1-th reflection plate RF1a may be electrically connected to the source electrode SE of the driving transistor DT and the second capacitor C2 through a first contact hole CHI of the first planarization layer 116a and the first passivation layer 115a. Therefore, the 1-1-th reflection plate RF1a may electrically connect the driving transistor DT and the first electrode 134 of the red light emitting diode 130R. The 1-2-th reflection plate RF1b may reflect light emitted from the red light emitting diode 130R above the red light emitting diode 130R. The 1-2-th reflection plate RF1b may serve as an electrode which electrically connects the second electrode 135 of the red light emitting diode 130R and the high potential power line VL1.

The second reflection plate RF2 includes a 2-1-th reflection plate RF2a overlapping most of the second sub pixel SP2 and a 2-2-th reflection plate RF2b overlapping the red light emitting diode 130R of the second sub pixel SP2. The 2-1-th reflection plate RF2a may reflect light emitted from the red light emitting diode 130R above the red light emitting diode 130R. The 2-1-th reflection plate RF2a is electrically connected to the source electrode SE of the driving transistor DT and the second capacitor C2 through the first contact hole CHI to transmit a driving current from the driving transistor DT to the first electrode 134 of the red light emitting diode 130R. The 2-2-th reflection plate RF2b may be used as an electrode which reflects the light emitted from the red light emitting diode 130R above the red light emitting diode 130R and electrically connects the second electrode 135 of the red light emitting diode 130R to the high potential power line VL1.

The third reflection plate RF3 may be formed as one third reflection plate RF3 which overlaps the entire third sub pixel SP3. The third reflection plate RF3 may reflect light emitted from the green light emitting diode 130G of the third sub pixel SP3 above the green light emitting diode 130G. The third reflection plate RF3 is electrically connected to the source electrode SE of the driving transistor DT and the second capacitor C2 through the first contact hole CHI to transmit a driving current from the driving transistor DT to the first electrode 134 of the green light emitting diode 130G.

The fourth reflection plate RF4 may be formed as one fourth reflection plate RF4 which overlaps the entire fourth sub pixel SP4. The fourth reflection plate RF4 may reflect light emitted from the blue light emitting diode 130B of the fourth sub pixel SP4 above the blue light emitting diode 130B. The fourth reflection plate RF4 is electrically connected to the source electrode SE of the driving transistor DT and the second capacitor C2 through the first contact hole CHI to transmit a driving current from the driving transistor DT to the first electrode 134 of the blue light emitting diode 130B.

In the meantime, even though it has been described that the first sub pixel SP1 and the second sub pixel SP2 are formed with two reflection plates RF and the third sub pixel SP3 and the fourth sub pixel SP4 are formed with one reflection plate RF, the reflection plate RF may be designed in various manners. For example, only one reflection plate RF may be disposed in all the plurality of sub pixels SP, like the third sub pixel SP3 and the fourth sub pixel SP4 or a plurality of reflection plates RF may be disposed in all the sub pixels like the first sub pixel SP1 and the second sub pixel SP2, but the reflection plate is not limited thereto.

Further, it has been described that the red light emitting diode 130R of each of the first sub pixel SP1 and the second sub pixel SP2 is electrically connected to the high potential power line VL1 through the 1-2-th reflection plate RF1b and the 2-2-th reflection plate RF2b. However, all the red light emitting diode 130R, the green light emitting diode 130G, and the blue light emitting diode 130B may be separately connected to the high potential power line VL1 without the reflection plate RF, but are not limited thereto.

Referring to FIG. 5, the second passivation layer 115b is disposed on the plurality of reflection plates RF. The second passivation layer 115b is an insulating layer which protects components below the second passivation layer 115b and may be configured by a single layer or double layers, or more layers of silicon oxide SiOx or silicon nitride SiNx, but is not limited thereto. For example, the second passivation layer 115b may be formed by inorganic film in a single layer or in multiple layers, for example, the inorganic film in a single layer may be a silicon oxide (SiOx) film or a silicon nitride (SiNx) film, and inorganic films in multiple layers may formed by alternately stacking one or more silicon oxide (SiOx) films, one or more silicon nitride (SiNx) films, and one or more amorphous silicon (a-Si), but the present disclosure is not limited thereto.

An adhesive layer AD is disposed on the second passivation layer 115b. The adhesive layer AD is formed on the entire surface of the first substrate 110 to fix the light emitting diode 130 disposed on the adhesive layer AD. The adhesive layer AD may be formed of a photo curable adhesive material which is cured by light. For example, the adhesive layer AD may be formed of an acrylic material including a photoresist, but is not limited thereto. The adhesive layer AD may be formed on the entire surface of the first substrate 110 excluding a pad area in which the first pad electrode PAD1 is disposed.

The plurality of light emitting diodes 130 are disposed in each of the plurality of sub pixels SP on the adhesive layer AD. The light emitting diode 130 is an element which emits light by a current and may include a red light emitting diode 130R which emits red light, a green light emitting diode 130G which emits green light, and a blue light emitting diode 130B which emits blue light and implement light with various colors including white by a combination thereof. For example, the light emitting diode 130 may be a light emitting diode (LED) or a micro LED, but is not limited thereto.

One red light emitting diode 130R is disposed in each of the first sub pixel SP1 and the second sub pixel SP2, respectively. One pair of green light emitting diodes 130G is disposed in the third sub pixel SP3, and one pair of blue light emitting diodes 130B is disposed in the fourth sub pixel SP4. That is, two red light emitting diodes 130R, two green light emitting diodes 130G, and two blue light emitting diodes 130B may be disposed in one pixel PX. At this time, each of the red light emitting diodes 130R is connected to the driving transistor DT of each of the first sub pixel SP1 and the second sub pixel SP2 to be individually driven. In contrast, one pair of green light emitting diodes 130G of the third sub pixel SP3 and one pair of blue light emitting diodes 130B of the fourth sub pixel SP4 are connected to one driving transistor DT in parallel to be driven respectively, for example, one pair of green light emitting diodes 130G of the third sub pixel SP3 is connected to one driving transistor DT in parallel to be driven, and one pair of blue light emitting diodes 130B of the fourth sub pixel SP4 is connected to one driving transistor DT in parallel to be driven.

The plurality of light emitting diodes 130 includes a first semiconductor layer 131, an emission layer 132, a second semiconductor layer 133, a first electrode 134, and a second electrode 135.

The first semiconductor layer 131 is disposed on the adhesive layer AD and the second semiconductor layer 133 is disposed on the first semiconductor layer 131. The first semiconductor layer 131 and the second semiconductor layer 133 may be layers formed by doping n-type or p-type impurities into a specific material. For example, the first semiconductor layer 131 and the second semiconductor layer 133 may be layers doped with n type or p type impurities into a material such as gallium nitride (GaN), indium aluminum phosphide (InAlP), or gallium arsenide (GaAs). The p-type impurity may be magnesium (Mg), zinc (Zn), beryllium (Be), and the like, and the n-type impurity may be silicon (Si), germanium (Ge), tin (Sn), and the like, but are not limited thereto.

The emission layer 132 is disposed between the first semiconductor layer 131 and the second semiconductor layer 133. The emission layer 132 is supplied with holes and electrons from the first semiconductor layer 131 and the second semiconductor layer 133 to emit light. The emission layer 132 may be formed by a single layer or a multi-quantum well (MQW) structure, and for example, may be formed of indium gallium nitride (InGaN), gallium nitride (GaN), or the like, but is not limited thereto.

The first electrode 134 is disposed on the first semiconductor layer 131. The first electrode 134 is an electrode which electrically connects the driving transistor DT and the first semiconductor layer 131. In this case, the first semiconductor layer 131 is a semiconductor layer doped with an n-type impurity and the first electrode 134 may be a cathode. The first electrode 134 may be disposed on a top surface of the first semiconductor layer 131 which is exposed from the emission layer 132 and the second semiconductor layer 133. The first electrode 134 may be configured by a conductive material, for example, a transparent conductive material, such as indium tin oxide (ITO) or indium zinc oxide (IZO) or an opaque conductive material, such as titanium (Ti), gold (Au), silver (Ag), copper (Cu) or an alloy thereof, but is not limited thereto.

The second electrode 135 is disposed on the second semiconductor layer 133.

The second electrode 135 may be disposed on the top surface of the second semiconductor layer 133. The second electrode 135 is an electrode which electrically connects the high potential power line VL1 and the second semiconductor layer 133. In this case, the second semiconductor layer 133 is a semiconductor layer doped with a p-type impurity and the second electrode 135 may be an anode. The second electrode 135 may be configured by a conductive material, for example, a transparent conductive material, such as indium tin oxide (ITO) or indium zinc oxide (IZO) or an opaque conductive material, such as titanium (Ti), gold (Au), silver (Ag), copper (Cu) or an alloy thereof, but is not limited thereto.

Next, the encapsulation layer 136 which encloses the first semiconductor layer 131, the emission layer 132, the second semiconductor layer 133, the first electrode 134, and the second electrode 135 is disposed. The encapsulation layer 136 is formed of an insulating material to protect the first semiconductor layer 131, the emission layer 132, and the second semiconductor layer 133. In the encapsulation layer 136, a contact hole which exposes the first electrode 134 and the second electrode 135 is formed to electrically connect a first connection electrode CE1 and a second connection electrode CE2 to the first electrode 134 and the second electrode 135.

In the meantime, a part of the side surface of the first semiconductor layer 131 may be exposed from the encapsulation layer 136. The light emitting diode 130 manufactured on the wafer is separated from the wafer to be transferred onto the display panel PN. However, during the process of separating the light emitting diode 130 from the wafer, a part of the encapsulation layer 136 may be torn. For example, a part of the encapsulation layer 136 which is adjacent to a lower edge of the first semiconductor layer 131 of the light emitting diode 130 is torn during the process of separating the light emitting diode 130 from the wafer. Accordingly, a part of a lower side surface of the first semiconductor layer 131 may be exposed to the outside. However, even though the lower portion of the light emitting diode 130 is exposed from the encapsulation layer 136, the first connection electrode CE1 and the second connection electrode CE2 are formed after forming the second planarization layer 116b and the third planarization layer 116c which cover the side surface of the first semiconductor layer 131. Accordingly, a short problem may be reduced.

The second planarization layer 116b and the third planarization layer 116c are disposed on the adhesive layer AD and the light emitting diode 130.

The second planarization layer 116b overlaps a part of side surfaces of the plurality of light emitting diodes 130 to fix and protect the plurality of light emitting diodes 130. The second planarization layer 116b may be formed using a halftone mask. Therefore, the second planarization layer 116b may be formed to have a step.

Specifically, a part of the second planarization layer 116b which is relatively adjacent to the light emitting diode 130 is formed to have a relatively smaller thickness and a part of the second planarization layer 116b which is relatively farther from the light emitting diode 130 may be formed to have a relatively larger thickness. A part of the second planarization layer 116b which is adjacent to the light emitting diode 130 is disposed to enclose the light emitting diode 130 and also may be in contact with a side surface of the light emitting diode 130. Therefore, a torn part of the encapsulation layer 136 which protects a side surface of the first semiconductor layer 131 of the light emitting diode 130 during the process of separating the light emitting diode 130 from the wafer to be transferred onto the display panel PN may be covered by the second planarization layer 116b. By doing this, contacts and short problems of the connection electrodes CE1 and CE2 and the first semiconductor layer 131 later may be suppressed.

The third planarization layer 116c is formed to cover upper portions of the second planarization layer 116b and the light emitting diode 130. The third planarization layer 116c may include a contact hole which exposes the first electrode 134 and the second electrode 135 of the light emitting diode 130. The first electrode 134 and the second electrode 135 of the light emitting diode 130 are exposed from the third planarization layer 116c and the third planarization layer 116c is partially disposed in an area between the first electrode 134 and the second electrode 135 to reduce a short problem. The second planarization layer 116b and the third planarization layer 116c may be configured by a single layer, double layers or more layers, and for example, may be formed of a photoresist or an acrylic organic material, but is not limited thereto.

In the meantime, the third planarization layer 116c may cover the light emitting diode 130 and an area adjacent to the light emitting diode 130. The third planarization layer 116c is disposed in an area of the sub pixel SP enclosed by the bank BB and may be disposed in an island shape, but the shape of the bank BB is not limited thereto. A bank BB may be disposed in a part of the top surface of the second planarization layer 116b and the third planarization layer 116c may be disposed in the other part of the top surface of the second planarization layer 116b.

The first connection electrode CE1 and the second connection electrode CE2 are disposed on the third planarization layer 116c. The first connection electrode CE1 is an electrode which electrically connects the second electrode 135 of the light emitting diode 130 and the high potential power line VL1. The first connection electrode CE1 may be electrically connected to the second electrode 135 of the light emitting diode 130 through a contact hole formed in the third planarization layer 116c.

The second connection electrode CE2 is an electrode which electrically connects the first electrode 134 of the light emitting diode 130 and the driving transistor DT. The second connection electrode CE2 may be connected to the 1-1-th reflection plate RF1a, the 2-1-th reflection plate RF2a, the third reflection plate RF3, and the fourth reflection plate RF4 of each of the plurality of sub pixels SP through contact holes formed in the third planarization layer 116c, the second planarization layer 116b, the adhesive layer AD, and the second passivation layer 115b. Therefore, the 1-1-th reflection plate RF1a, the 2-1-th reflection plate RF2a, the third reflection plate RF3, and the fourth reflection plate RF4 are also connected to the source electrode SE of the driving transistor DT so that the source electrode SE of the driving transistor DT and the first electrode 134 of the light emitting diode 130 may be electrically connected to each other.

In the meantime, in the drawing, it is illustrated that the first electrode 134, the second connection electrode CE2, and the reflection plate RF are electrically connected to the source electrode SE of the driving transistor DT. However, the first electrode 134, the second connection electrode CE2, and the reflection plate RF may be connected to the drain electrode DE of the driving transistor DT, but it is not limited thereto.

A bank BB is disposed on the first connection electrode CE1, the second connection electrode CE2, and the second planarization layer 116b exposed from the third planarization layer 116c. The bank BB may be disposed to be spaced apart from the light emitting diode 130 with a predetermined interval and at least partially overlaps the reflection plate RF. For example, the bank BB may cover a part of the second connection electrode CE2 formed in the contact holes of the third planarization layer 116c and the second planarization layer 116b. Further, the bank BB may be disposed on the second planarization layer 116b with a predetermined interval from the light emitting diode 130. In this case, the bank BB and the third planarization layer 116c may be spaced apart from each other on a part of the second planarization layer 116b having a smaller thickness. That is, an end of the bank BB and an end of the third planarization layer 116c may be disposed on a part of the second planarization layer 116b having a smaller thickness formed by a halftone mask process to be spaced apart from each other. The bank BB may be formed of an opaque material to reduce color mixture between the plurality of sub pixels SP and for example, may be formed of black resin, but is not limited thereto.

In the meantime, a thickness of a part of the bank BB which is formed in the contact holes of the third planarization layer 116c and the second planarization layer 116b to cover a part of the second connection electrode CE2 and a thickness of a part of the bank BB which is disposed on the second planarization layer 116b may be different from each other. Specifically, when the part of the bank BB covers a part of the second connection electrode CE2 formed in the contact holes of the third planarization layer 116c and the second planarization layer 116b, since the contact hole is formed from the second passivation layer 115b to the third planarization layer 116c, the bank BB may be disposed below the light emitting diode 130, that is, disposed to be lower than the light emitting diode 130. Therefore, the thickness of the part of the bank BB which covers a part of the second connection electrode CE2 formed in the contact holes of the third planarization layer 116c and the second planarization layer 116b may be larger than the thickness of a part of the bank BB disposed on the second planarization layer 116b.

A first protection layer 117 is disposed on the first connection electrode CE1, the second connection electrode CE2, and the bank BB. The first protection layer 117 is a layer which protects components below the first protection layer 117. The first protection layer 117 may be configured by a single layer, double layers or more layers, and for example, configured by benzocyclobutene, a light-transmitting epoxy, a photoresist, or an acrylic organic material, but is not limited thereto.

A plurality of first pad electrodes PAD1 are disposed in a first pad area PA1 and a second pad area PA2 of the first substrate 110. Each of the plurality of first pad electrodes PAD1 may be configured by a plurality of conductive layers. For example, each of the plurality of first pad electrodes PAD1 includes a first conductive layer PE1a, a second conductive layer PE1b, and a third conductive layer PE1c.

First, the first conductive layer PE1a is disposed on the second interlayer insulating layer 114. The first conductive layer PE1a may be formed of the same conductive material as the source electrode SE and the drain electrode DE and for example, may be configured by copper (Cu), aluminum (Al), molybdenum (Mo), nickel (Ni), titanium (Ti), chrome (Cr), or an alloy thereof, but is not limited thereto.

The first passivation layer 115a is disposed on the first conductive layer PE1a and the second conductive layer PE1b is disposed on the first passivation layer 115a. The second conductive layer PE1b may be formed of the same conductive material as the reflection plate RF and for example, may be configured by silver (Ag), aluminum (Al), molybdenum (Mo), or an alloy thereof, but is not limited thereto.

The third conductive layer PE1c is disposed on the second conductive layer PE1b. The third conductive layer PE1c may be formed of the same conductive material as the first connection electrode CE1 and the second connection electrode CE2, and for example, a transparent conductive material, such as indium tin oxide (ITO) or indium zinc oxide (IZO), but is not limited thereto.

At this time, even though it is not illustrated in the drawings, a part of the plurality of conductive layers of the first pad electrode PAD1 is electrically connected to a plurality of wiring lines on the first substrate 110 to supply various signals to a plurality of wiring lines and a plurality of sub pixels SP. For example, the first conductive layer PE1a and/or the second conductive layer PE1b of the first pad electrode PAD1 is connected to the data line DL, the high potential power line VL1, the low potential power line VL2, and the like disposed in the active area AA to transmit signals thereto.

A first metal layer ML1, a second metal layer ML2, and a plurality of insulating layers may be disposed below the first pad electrode PAD1. The first metal layer ML1, the second metal layer ML2, and the plurality of insulating layers are disposed below the first pad electrode PAD1 to adjust a step of the first pad electrode PAD1. For example, the buffer layer 111, the gate insulating layer 112, the first metal layer ML1, the first interlayer insulating layer 113, and the second metal layer ML2 may be sequentially disposed between the first pad electrode PAD1 and the first substrate 110. The first metal layer ML1 may be formed of the same conductive material as the gate electrode GE and the second metal layer ML2 may be formed of the same conductive material as a 1-2-th capacitor electrode C1b. However, the plurality of insulating layers, the first metal layer ML1, and the second metal layer ML2 below the first pad electrode PAD1 may be omitted depending on a design and are not limited thereto.

A second substrate 120 is disposed below the first substrate 110. The second substrate 120 is a substrate which supports components disposed below the display device 100 and may be an insulating substrate. For example, the second substrate 120 may be formed of glass or resin. Further, the second substrate 120 may include polymer or plastic. The second substrate 120 may be formed of the same material as the first substrate 110. In some exemplary embodiments, the second substrate 120 may be formed of a plastic material having flexibility or a flexible polymer film. For example, the flexible polymer film may be made of any one of polyimide (PI), polyethylene terephthalate (PET), acrylonitrile-butadiene-styrene copolymer (ABS), polymethyl methacrylate (PMMA), polyethylene naphthalate (PEN), polycarbonate (PC), polyethersulfone (PES), polyarylate (PAR), polysulfone (PSF), cyclic olefin copolymer (COC), triacetylcellulose (TAC), polyvinyl alcohol (PVA), and polystyrene (PS), and the present disclosure is not limited thereto.

A bonding layer BDL is disposed between the first substrate 110 and the second substrate 120. The bonding layer BDL may be formed of a material which is cured by various curing methods to bond the first substrate 110 and the second substrate 120. The bonding layer BDL may be disposed in a partial area between the first substrate 110 and the second substrate 120 or may be disposed in the entire area.

A plurality of second pad electrodes PAD2 are disposed on a rear surface of the second substrate 120. The plurality of second pad electrodes PAD2 are electrodes which transmit a signal from a driving component disposed on the rear surface of the second substrate 120 to a plurality of side lines SRL, a plurality of first pad electrodes PAD1 and a plurality of wiring lines on the first substrate 110. The plurality of second pad electrodes PAD2 are disposed in an end portion of the second substrate 120 in the non-active area NA to be electrically connected to the side line SRL which covers the end portion of the second substrate 120.

At this time, the plurality of second pad electrodes PAD2 may be also disposed so as to correspond to the plurality of pad areas PA1 and PA2. The plurality of first pad electrodes PAD1 may be disposed to correspond to the plurality of second pad electrodes PAD2, respectively, and then the first pad electrode PAD1 and the second pad electrode PAD2 which overlap each other may be electrically connected through the side line SRL.

Each of the plurality of second pad electrodes PAD2 includes a plurality of conductive layers. For example, each of the plurality of second pad electrodes PAD2 includes a fourth conductive layer PE2a, a fifth conductive layer PE2b, and a sixth conductive layer PE2c.

First, the fourth conductive layer PE2a is disposed below the second substrate 120. The fourth conductive layer PE2a may be configured by a conductive material such as copper (Cu), aluminum (Al), molybdenum (Mo), nickel (Ni), titanium (Ti), chrome (Cr), or an alloy thereof, but is not limited thereto.

The fifth conductive layer PE2b is disposed below the fourth conductive layer PE2a. The fifth conductive layer PE2b may be configured by a conductive material, such as copper (Cu), aluminum (Al), molybdenum (Mo), nickel (Ni), titanium (Ti), chrome (Cr), or an alloy thereof, but is not limited thereto.

The sixth conductive layer PE2c is disposed below the fifth conductive layer PE2b. The sixth conductive layer PE2c may be formed of a conductive material, for example, a transparent conductive material, such as indium tin oxide (ITO) or indium zinc oxide (IZO), but is not limited thereto.

The second protection layer 121 is disposed in the remaining area of the second substrate 120. The second protection layer 121 may protect various wiring lines and driving components formed on the second substrate 120. The second protection layer 121 may be configured by a single layer, double layers or more layers, and for example, configured by benzocyclobutene, a light-transmitting epoxy, a photoresist, or an acrylic organic insulating material, but is not limited thereto.

Even though it is not illustrated in the drawing, a driving component including a plurality of flexible films and a printed circuit board may be disposed on a rear surface of the second substrate 120. The plurality of flexible films are components in which various components such as a data driver IC are disposed on a base film having a ductility to supply signals to the plurality of sub pixels SP. The printed circuit board is a component which is electrically connected to the plurality of flexible films to supply signals to the driving IC. On the printed circuit board, various components for supplying various signals to the driving IC may be disposed.

For example, the fourth conductive layer PE2a and/or the fifth conductive layer PE2b of the second pad electrode PAD2 extends to the plurality of flexible films disposed on the rear surface of the second substrate 120 to be electrically connected to the plurality of flexible films. The plurality of flexible films may supply various signals to the plurality of side lines SRL, the plurality of first pad electrodes PAD1, the plurality of wiring lines, and the plurality of sub pixels SP through the second pad electrode PAD2. Therefore, the signal from the driving component may be transmitted to the signal line and the plurality of sub pixels SP on the front surface of the first substrate 110 through the plurality of second pad electrodes PAD2 of the second substrate 120, the side line SRL, and the plurality of first pad electrodes PAD1 of the first substrate 110.

Next, the plurality of side lines SRL are disposed on the side surfaces of the first substrate 110 and the second substrate 120. The plurality of side lines SRL may electrically connect the plurality of first pad electrodes PAD1 formed on the top surface of the first substrate 110 and the plurality of second pad electrodes PAD2 formed on the rear surface of the second substrate 120. The plurality of side lines SRL may be disposed so as to enclose the side surface of the display device 100. Each of the plurality of side lines SRL may cover the first pad electrode PAD1 at an end portion of the first substrate 110, a side surface of the first substrate 110, a side surface of the second substrate 120, and the second pad electrode PAD2 at an end portion of the second substrate 120. For example, the plurality of side lines SRL may be formed by a pad printing method using a conductive ink, for example, including silver (Ag), copper (Cu), molybdenum (Mo), chrome (Cr), and the like.

A side insulating layer 140 which covers the plurality of side lines SRL is disposed. The side insulating layer 140 may be formed on the top surface of the first substrate 110, the side surface of the first substrate 110, the side surface of the second substrate 120, and the rear surface of the second substrate 120 to cover the side line SRL. The side insulating layer 140 may protect the plurality of side lines SRL.

In the meantime, when the plurality of side lines SRL are formed of a metal material, there may be a problem in that external light is reflected from the plurality of side lines SRL or light emitted from the light emitting diode 130 is reflected from the plurality of side lines SRL to be visibly recognized by the user. Therefore, the side insulating layer 140 is configured to include a black material to suppress reflection of the external light. For example, the side insulating layer 140 may be formed by a pad printing method using an insulating material including a black material, for example, a black ink.

A seal member 150 which covers the side insulating layer 140 is disposed. The seal member 150 is disposed so as to enclose the side surface of the display device 100 to protect the display device 100 from external impacts, moisture, and oxygen. For example, the seal member 150 may be formed of polyimide (PI), poly urethane, epoxy, acryl-based insulating material, or the like, but is not limited thereto.

An optical film MF is disposed on the seal member 150, the side insulating layer 140, and the first protection layer 117. The optical film MF may be a functional film which implements a higher quality of images while protecting the display device 100. For example, the optical film MF may be an anti-scattering film, an anti-glare film, an anti-reflecting film, a low-reflecting film, an Oled transmittance controllable film, or a polarizer, but is not limited thereto.

In the meantime, an edge of the seal member 150 and an edge of the optical film MF may be disposed on the same line. The optical film ML having a larger size is attached above the first substrate 110 during the manufacturing process of the display device 100 and the seal member 150 which covers the side insulating layer 140 may be formed. Thereafter, laser is irradiated on the seal member 150 and the optical film MF so as to correspond to an edge of the display device 100 to cut a part of the seal member 150 and the optical film MF. Accordingly, the size of the display device 100 is adjusted by an outer periphery cutting process of the seal member 150 and the optical film MF and the edge of the display device 100 may be formed to be flat.

In the meantime, the display device 100 according to the exemplary embodiment of the present disclosure may be formed with a zero-bezel structure with substantially no bezel using the side line SRL. At this time, in the zero-bezel structure, a separate mechanism which encloses the display panel PN and serves as a ground may not be formed. Therefore, as compared with a general display device 100 with a mechanism, in the display device 100 with a zero-bezel structure, the static electricity may more easily enter into the display panel PN through the side line SRL on the side surface of the display panel PN and the first pad electrode PAD1 connected to the side line SRL. Therefore, in the display device 100 according to the exemplary embodiment of the present disclosure, an electrostatic discharge circuit ESD is formed in the display panel PN to protect the display panel PN from the static electricity entering the display panel PN.

Hereinafter, an electrostatic discharge circuit ESD of the display device 100 according to the exemplary embodiment of the present disclosure will be described with reference to FIGS. 6 to 9.

Figure 6:
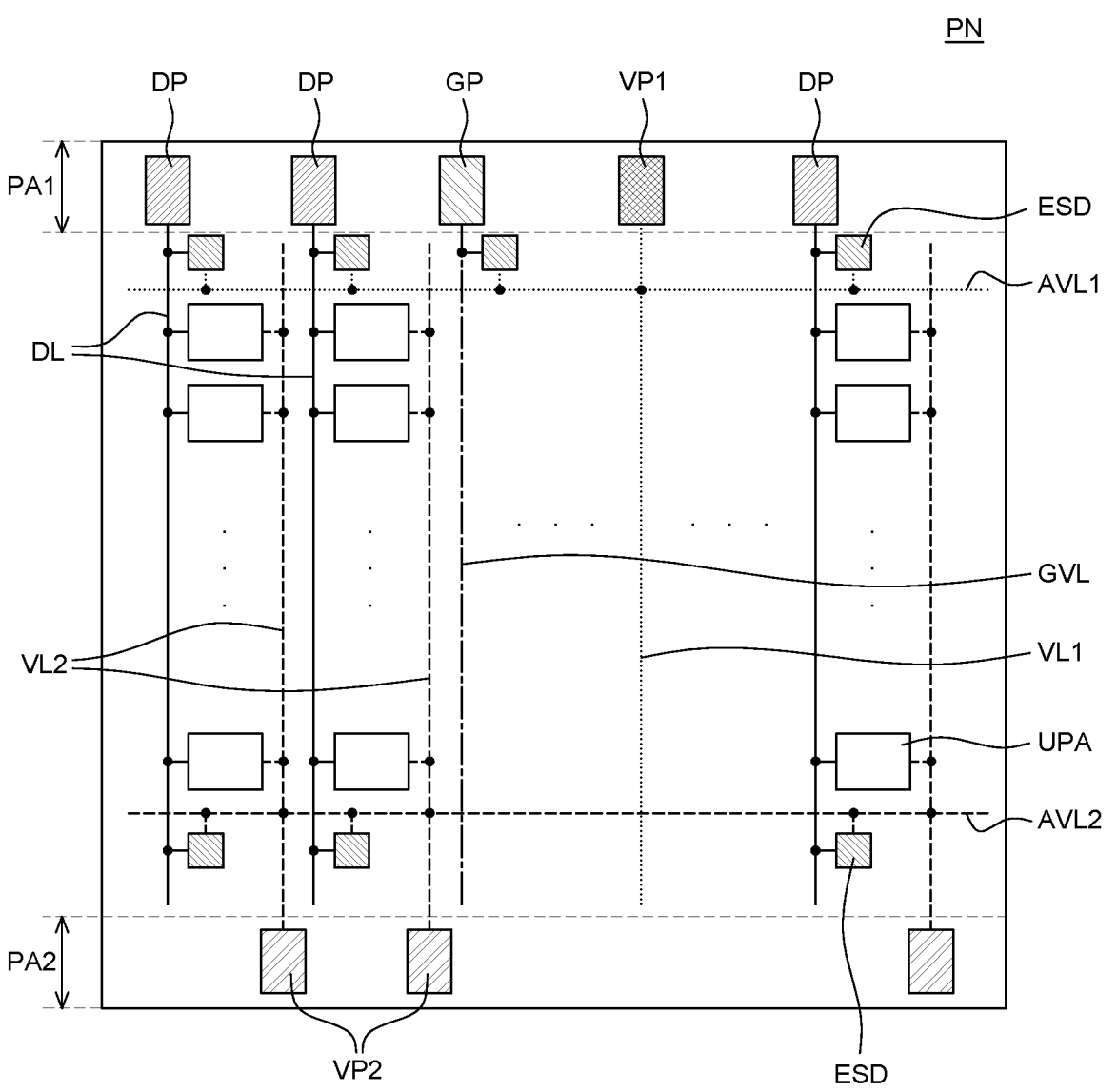
FIG. 6 is a schematic diagram of a display device according to an exemplary embodiment of the present disclosure.
Figure 7:
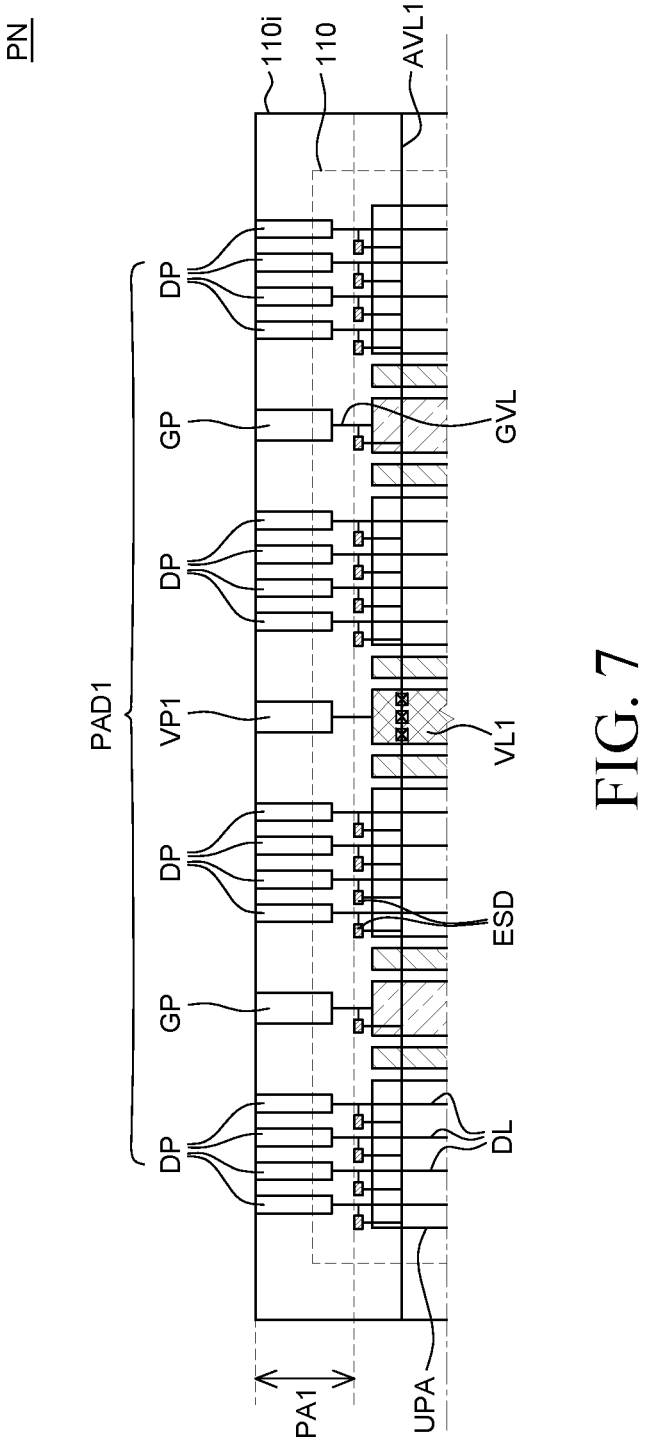
FIG. 7 is an enlarged plan view of a display device according to an exemplary embodiment of the present disclosure.
Figure 8A:
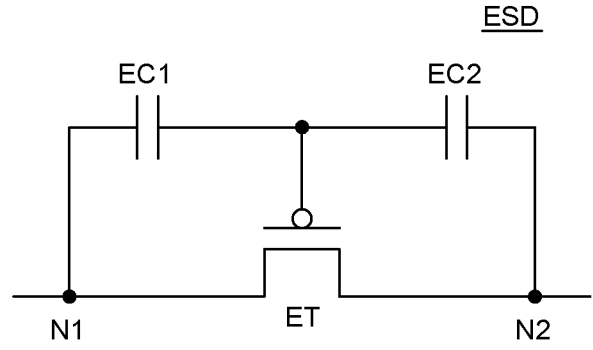
FIGS. 8A and 8B are circuit diagrams of an electrostatic discharge circuit of a display device according to an exemplary embodiment of the present disclosure.
Figure 8B:
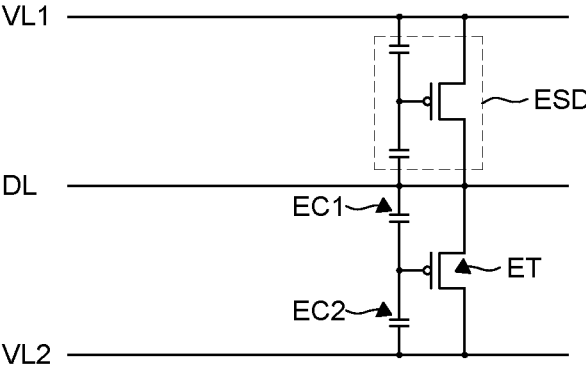
Figure 9:
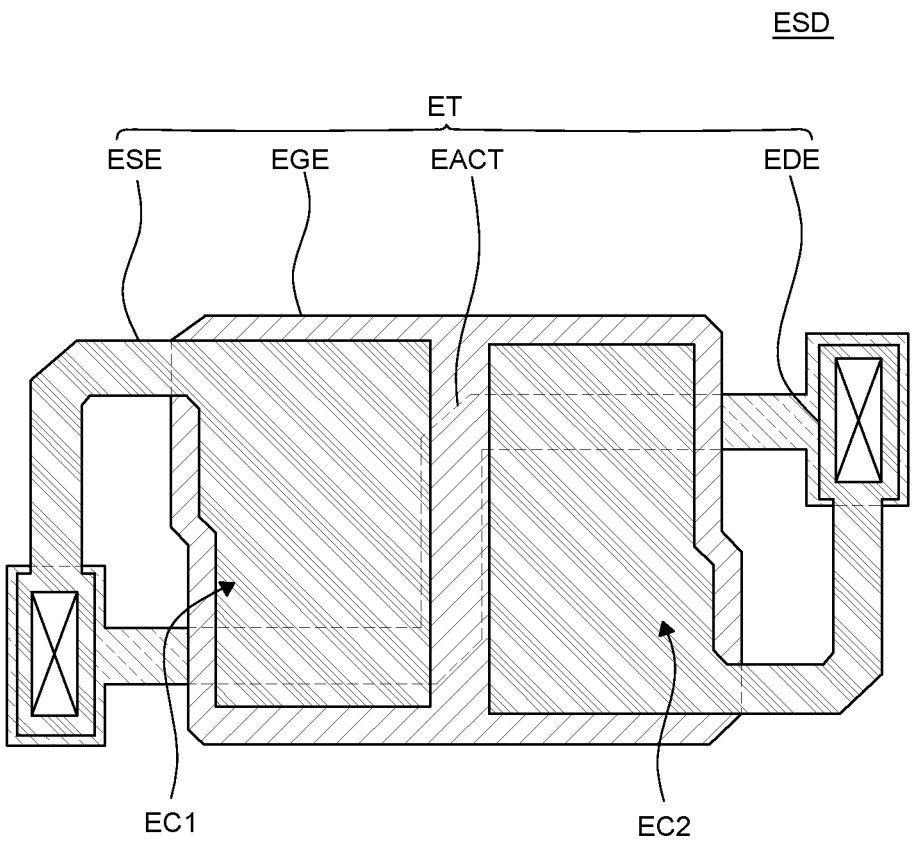
FIG. 9 is a plan view of an electrostatic discharge circuit of a display device according to an exemplary embodiment of the present disclosure.

FIG. 6 is a schematic diagram of a display device according to an exemplary embodiment of the present disclosure. FIG. 7 is an enlarged plan view of a display device according to an exemplary embodiment of the present disclosure. FIGS. 8A and 8B are circuit diagrams of an electrostatic discharge circuit of a display device according to an exemplary embodiment of the present disclosure. FIG. 9 is a plan view of an electrostatic discharge circuit of a display device according to an exemplary embodiment of the present disclosure. Specifically, FIG. 6 is a schematic diagram for explaining a connection relationship of a plurality of electrostatic discharge circuits ESD and another configuration of the display panel PN. FIG. 7 is a plan view enlarging an area adjacent to the first pad area PA1 in an area where the electrostatic discharge circuit ESD is disposed. FIG. 8A is a circuit diagram of one electrostatic discharge circuit ESD and FIG. 8B is a circuit diagram illustrating a connection relationship of one data line DL and the electrostatic discharge circuit ESD. In FIG. 6, for the convenience of description, the data line DL, the high potential power line VL1, and the auxiliary high potential power line AVL1, the low potential power line VL2, and the auxiliary low potential power line AVL2 are represented with different types of lines, respectively.

Referring to FIGS. 6 and 7, a plurality of electrostatic discharge circuits ESD are disposed on the display panel PN. The electrostatic discharge circuit ESD may protect a plurality of wiring lines from static electricity entering the display panel PN. The electrostatic discharge circuit ESD may protect the plurality of wiring lines using the high potential power line VL1 or the low potential power line VL2 so as not to be damaged by the static electricity. If the static electricity enters the plurality of wiring lines, an insulating layer between the plurality of wiring lines is damaged to cause the short problem between the plurality of wiring lines or disconnection of the plurality of wiring lines.

The electrostatic discharge circuit ESD may be disposed on the first substrate 110 of the display panel PN together with the plurality of wiring lines. The electrostatic discharge circuit ESD may be disposed on the first substrate 110 so as to be adjacent to an upper area and a lower area of the display panel PN. Specifically, the plurality of electrostatic discharge circuits ESD may be disposed between the plurality of pad areas PA1 and PA2 and the plurality of pixel areas UPA and between the plurality of pad areas PA1 and PA2 and the plurality of gate driving areas GA on the first substrate 110. For example, some of the plurality of electrostatic discharge circuits ESD may be disposed between a first pad area PA1 and a pixel area UPA and between the first pad area PA1 and the gate driving area GA and the others may be disposed between a second pad area PA2 and a pixel area UPA and between the second pad area PA2 and the gate driving area GA.

One end of each of the plurality of electrostatic discharge circuits ESD is electrically connected to any one of the plurality of wiring lines and the other end is electrically connected to any one of the high potential power line VL1 or the low potential power line VL2. The electrostatic discharge circuit ESD may be connected between a wiring line extending from a data pad DP and a gate pad GP, among the plurality of first pad electrodes PAD1, and the high potential power line VL1 or connected between a wiring line extending from the data pad DP and the gate pad GP and the low potential power line VL2.

For example, an end of some of the electrostatic discharge circuits ESD disposed to be adjacent to the upper area of the display panel PN, that is, the first pad area PA1 may be electrically connected to the data line DL extending from the data pad DP and the other end may be electrically connected to the auxiliary high potential power line AVL1 adjacent to the first pad area PA1. An end of the other of the electrostatic discharge circuits ESD disposed to be adjacent to the first pad area PA1 may be electrically connected to the gate driving line GVL extending from the gate pad GP and the other end may be electrically connected to the auxiliary high potential power line AVL1. An end of some of the electrostatic discharge circuits ESD disposed to be adjacent to the second pad area PA2 which is the lower area of the display panel PN may be electrically connected to the data line DL and the other end may be electrically connected to the auxiliary low potential power line AVL2. An end of the other of the electrostatic discharge circuits ESD disposed to be adjacent to the second pad area PA2 may be electrically connected to the gate driving line GVL extending from the gate pad GP and the other end may be electrically connected to the auxiliary low potential power line AVL2.

In this case, one data line DL may be connected to an electrostatic discharge circuit ESD adjacent to the first pad area PA1 and an electrostatic discharge circuit ESD adjacent to the second pad area PA2 together. Similarly, one gate driving line GVL may be connected to an electrostatic discharge circuit ESD adjacent to the first pad area PA1 and an electrostatic discharge circuit ESD adjacent to the second pad area PA2. The static electricity entering to one end of the gate driving line GVL and one end of the data line DL may be discharged through the electrostatic discharge circuit ESD adjacent to the first pad area PA1. The static electricity entering to the other end of the gate driving line GVL and the other end of the data line DL may be discharged through the electrostatic discharge circuit ESD adjacent to the second pad area PA2.

Even though in FIG. 6, it is illustrated that the electrostatic discharge circuit ESD is connected to the gate driving line GVL and the data line DL, the electrostatic discharge circuit ESD may be electrically connected to a wiring line other than the gate driving line GVL and the data line DL, the static electricity entering to the ends of the wiring line other than the gate driving line GVL and the data line DL may be discharged through the electrostatic discharge circuit ESD, but is not limited thereto.

Referring to FIG. 8A, each of the plurality of electrostatic discharge circuits ESD includes a protection transistor ET, a first protection capacitor EC1, and a second protection capacitor EC2. A protection source electrode ESE and a protection drain electrode EDE of the protection transistor ET are connected to a first node N1 and a second node N2, respectively. The first protection capacitor EC1 is connected between the first node N1 and the protection gate electrode EGE of the protection transistor ET and the second protection capacitor EC2 is connected between the second node N2 and the protection gate electrode EGE of the protection transistor ET.

Any one of the first node N1 and the second node N2 of the electrostatic discharge circuit ESD may be electrically connected to the plurality of wiring lines, such as the data line DL and the gate driving line GVL and the remaining of the first node N1 and the second node N2 of the electrostatic discharge circuit ESD may be electrically connected to any one of the high potential power line VL1 and the low potential power line VL2. For example, the first node N1 may be electrically connected to the plurality of wiring lines and the second node N2 may be electrically connected to any one of the high potential power line VL1 or the low potential power line VL2. Alternatively, the second node N2 may be electrically connected to the plurality of wiring lines and the first node N1 may be electrically connected to any one of the high potential power line VL1 or the low potential power line VL2.

If an abnormally high voltage is generated in the wiring line connected to the first node N1 due to the static electricity, a voltage is applied from the first protection capacitor EC1 to the protection gate electrode EGE of the protection transistor ET to turn on the protection transistor ET. Accordingly, the turned-on protection transistor ET may discharge the static electricity to the high potential power line VL1 or the low potential power line VL2. However, the configuration of the electrostatic discharge circuit ESD is illustrative, and is not limited thereto.

Referring to FIG. 8B, as described above, one pair of electrostatic discharge circuits ESD may be connected to one wiring line. For example, one pair of electrostatic discharge circuits ESD may be electrically connected to the high potential power line VL1 and the low potential power line VL2, respectively, with one data line DL therebetween. First nodes N1 of one pair of electrostatic discharge circuits ESD may be connected to wiring lines, such as a data line DL and second nodes N2 of one pair of electrostatic discharge circuits ESD may be connected to the high potential power line VL1 and the low potential power line VL2, respectively, such that the static electricity entering to the ends of the wiring lines, such as a data line DL may be discharged through the one pair of electrostatic discharge circuit ESD.

Referring to FIG. 9, a protection active layer EACT of the protection transistor ET is disposed on the first substrate 110. One end of the protection active layer EACT may be connected to the first node N1 and the other end may be connected to the second node N2.

The protection gate electrode EGE of the protection transistor ET is disposed on the protection active layer EACT. The protection gate electrode EGE may be disposed to overlap the remaining part of the protection active layer EACT excluding one end and the other end.

A protection source electrode ESE and a protection drain electrode EDE of the protection transistor ET are disposed on the protection gate electrode EGE. The protection source electrode ESE is electrically connected to one end of the protection active layer EACT to at least partially overlap the protection gate electrode EGE. The protection drain electrode EDE is electrically connected to the other end of the protection active layer EACT to at least partially overlap the protection gate electrode EGE.

The protection gate electrode EGE and the protection source electrode ESE of the protection transistor ET at least partially overlap to form a first protection capacitor EC1. The protection gate electrode EGE and the protection drain electrode EDE of the protection transistor ET at least partially overlap to form a second protection capacitor EC2.

At this time, the configurations of the electrostatic discharge circuit ESD may be formed together when a pixel circuit formed in the plurality of pixel areas UPA is formed. The protection active layer EACT, the protection gate electrode EGE, the protection source electrode ESE, and the protection drain electrode EDE of the protection transistor ET may be formed of the same material as the configuration of the pixel circuit, for example, the driving transistor DT. For example, the protection active layer EACT of the protection transistor ET and the active layer ACT of the driving transistor DT are formed together between the buffer layer 111 and the gate insulating layer 112. Further, the protection gate electrode EGE of the protection transistor ET and the gate electrode GE of the driving transistor DT may be formed together between the gate insulating layer 112 and the first interlayer insulating layer 113. The protection source electrode ESE and the protection drain electrode EDE of the protection transistor ET and the source electrode SE and the drain electrode DE of the driving transistor DT may be formed together between the second interlayer insulating layer 114 and the first passivation layer 115a. However, the electrostatic discharge circuit ESD may be formed by a separate process, but is not limited thereto.

Accordingly, in the display device 100 according to the exemplary embodiment of the present disclosure, the electrostatic discharge circuit ESD is disposed in an area adjacent to the side line SRL to minimize or at least reduce entering of the static electricity into the display panel PN through the side line SRL, the plurality of first pad electrodes PAD1, and the plurality of wiring lines. At this time, the electrostatic discharge circuit ESD may be connected to both one end and the other end of each of the plurality of wiring lines. Accordingly, the static electricity entering to both ends of the plurality of wiring lines may be efficiently discharged and the reliability of the display device 100 may be improved.

Figure 10A:
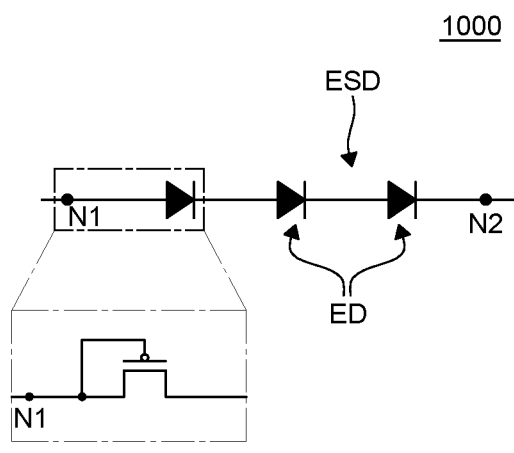
FIGS. 10A and 10B are circuit diagrams of an electrostatic discharge circuit of a display device according to another exemplary embodiment of the present disclosure.
Figure 10B:
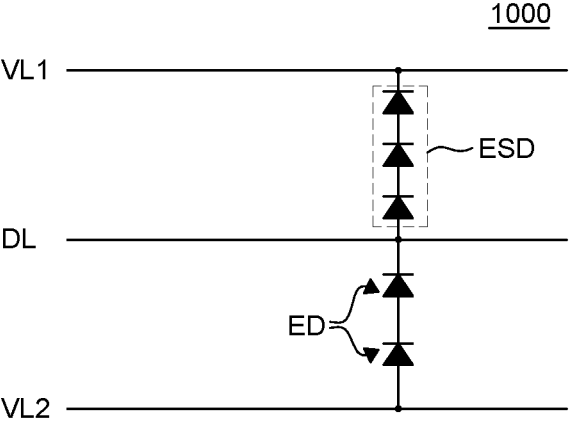
Figure 11:
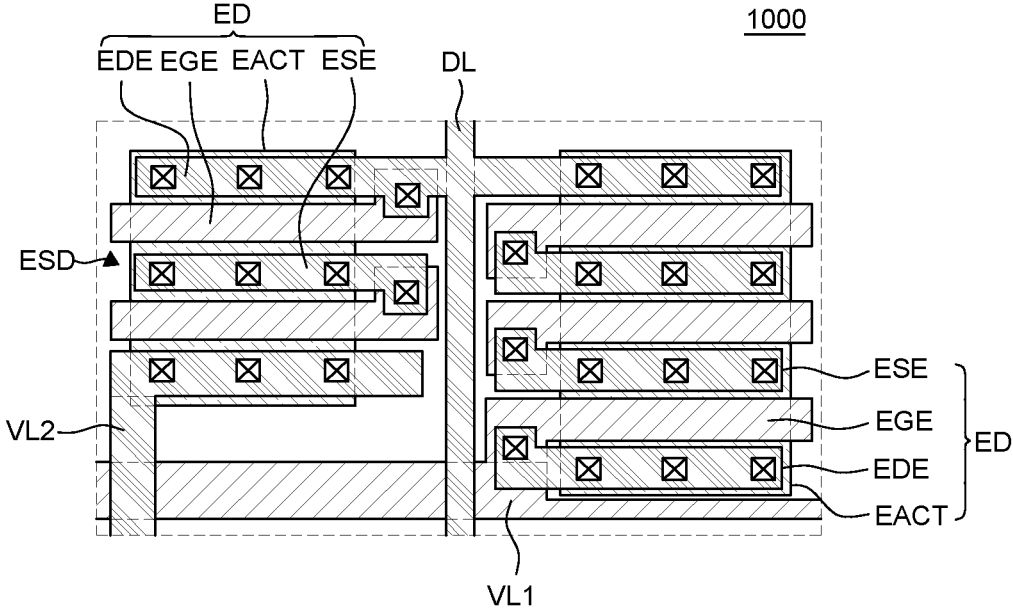
FIG. 11 is a plan view of an electrostatic discharge circuit of a display device according to another exemplary embodiment of the present disclosure.

FIGS. 10A and 10B are circuit diagrams of an electrostatic discharge circuit of a display device according to another exemplary embodiment of the present disclosure. FIG. 11 is a plan view of an electrostatic discharge circuit of a display device according to another exemplary embodiment of the present disclosure. Specifically, FIG. 10A is a circuit diagram of one electrostatic discharge circuit ESD and FIG. 10B is a circuit diagram illustrating a connection relationship of one data line DL and the electrostatic discharge circuit ESD. A display device 1000 of FIG. 10A, FIG. 10B and FIG. 11 has the substantially same configuration as the display device 100 of FIGS. 1 to 9 except for a configuration of the electrostatic discharge circuit ESD.

Referring to FIGS. 10A and 10B, the electrostatic discharge circuit ESD includes a plurality of protection diodes ED. An electrostatic discharge circuit ESD connected between the plurality of wiring lines on the display panel PN and the high potential power line VL1 and an electrostatic discharge circuit ESD connected between the plurality of wiring lines and the low potential power lines VL2 may be each configured by a plurality of protection diodes ED which are connected in series between the first node N1 and the second node N2. The first node N1 of the electrostatic discharge circuit ESD may be connected to any one of the plurality of wiring lines and the low potential power line VL2 and the second node N2 may be connected to one of the plurality of wiring lines and the high potential power line VL1. For example, the electrostatic discharge circuit ESD configured by the plurality of protection diodes ED may be connected between one data line DL and the high potential power line VL1 and between one data line DL and the low potential power line VL2.

When an abnormal voltage generated by the static electricity is a positive voltage, the static electricity may be discharged through the electrostatic discharge circuit ESD which is electrically connected to the high potential power line VL1. In contrast, when an abnormal voltage generated by the static electricity is a negative voltage, the static electricity may be discharged through the electrostatic discharge circuit ESD which is electrically connected to the low potential power line VL2.

In the meantime, in FIG. 10B, it is illustrated that the electrostatic discharge circuit ESD electrically connected to the high potential power line VL1 and the electrostatic discharge circuit ESD electrically connected to the low potential power line VL2 have different numbers of protection diodes ED. However, the number of protection diodes ED may vary depending on the design, but is not limited thereto.

Referring to FIG. 11, the protection diode ED of the electrostatic discharge circuit ESD may be formed using the protection transistor ET. The protection gate electrode EGE of the protection transistor ET is electrically connected to one of the protection source electrode ESE and the protection drain electrode EDE to form the protection diode ED. For example, the protection gate electrode EGE and the protection source electrode ESE of the protection transistor ET are connected to form a protection diode ED in which the current flows in only one direction from the protection source electrode ESE to the protection drain electrode EDE. However, depending on the design, the protection drain electrode EDE rather than the protection source electrode ESE may be connected to the protection gate electrode EGE, but is not limited thereto.

For example, in the protection diode ED connected between the data line DL and the low potential power line VL2, the protection drain electrode EDE is connected to the data line DL and the protection source electrode ESE is connected to the low potential power line VL2. Further, the protection gate electrode EGE may overlap the protection active layer EACT and may be electrically connected to the protection source electrode ESE. In the protection diode ED connected between the data line DL and the high potential power line VL1, the protection source electrode ESE is connected to the data line DL and the protection drain electrode EDE is connected to the high potential power line VL1. Further, the protection gate electrode EGE may overlap the protection active layer EACT and may be electrically connected to the protection source electrode ESE.

At this time, as illustrated in FIG. 11, one pair of electrostatic discharge circuits ESD connected to one wiring line may be disposed to be adjacent to each other. For example, one pair of electrostatic discharge circuits ESD may be disposed together in an upper area of the display panel PN adjacent to the first pad area PAD1 and disposed together in a lower area of the display panel PN adjacent to the second pad area PAD2. However, one pair of electrostatic discharge circuits ESD may be separately disposed in the upper area and the lower area of the display panel PN, respectively, but is not limited thereto, for example, one electrostatic discharge circuit ESD of the one pair of electrostatic discharge circuits ESD may be disposed in an upper area of the display panel PN adjacent to the first pad area PAD1 and the other electrostatic discharge circuit ESD of the one pair of electrostatic discharge circuits ESD is disposed in a lower area of the display panel PN adjacent to the second pad area PAD2.

Accordingly, in the display device 1000 according to another exemplary embodiment of the present disclosure, the electrostatic discharge circuit ESD configured by a plurality of protection diodes ED are included to protect the plurality of wiring lines from the static electricity. The electrostatic discharge circuit ESD is configured by a plurality of protection diodes ED in which the current flows only in one direction. When an abnormal voltage is generated in the plurality of wiring lines, due to the static electricity, the static electricity may be discharged to the outside of the plurality of wiring lines through the plurality of protection diodes ED. Accordingly, in the display device 1000 with a zero-bezel structure which is vulnerable to the static electricity, the plurality of electrostatic discharge circuits ESD is formed in an area adjacent to the side line SRL to protect the display device 1000 from the static electricity.

The exemplary embodiments of the present disclosure can also be described as follows:

According to an aspect of the present disclosure, a display device includes a first substrate in which a plurality of pixel areas and a plurality of gate driving areas are defined; a plurality of first pad electrodes which is disposed on the first substrate and includes a plurality of data pads and a plurality of gate pads; a plurality of wiring lines which is disposed on the first substrate and is connected to the plurality of data pads and the plurality of gate pads; and one pair of electrostatic discharge circuits connected to the plurality of wiring lines, respectively, wherein one of the one pair of electrostatic discharge circuits is electrically connected to a plurality of high potential power lines and the other of the one pair of electrostatic discharge circuits is electrically connected to a plurality of low potential power lines. The plurality of pixel areas may include a first sub-pixel, a second sub-pixel, a third sub-pixel and a fourth sub-pixel, and wherein the first sub-pixel and the second sub-pixel are configured to emit light with same color.

One red light emitting diode may be disposed in each of the first sub pixel and the second sub pixel, respectively, two green light emitting diodes may be disposed in the third sub pixel, and two blue light emitting diodes may be disposed in the fourth sub pixel.

Each of the red light emitting diodes may be connected to one driving transistor of each of the first sub pixel and the second sub pixel to be individually driven, the two green light emitting diodes of the third sub pixel may be connected to one driving transistor in parallel to be driven in common, and the two blue light emitting diodes of the fourth sub pixel may be connected to one driving transistor in parallel to be driven in common.

The display device may further comprises a first reflection plate corresponding to the first sub pixel, a second reflection plate corresponding to the second sub pixel, a third reflection plate corresponding to the third sub pixel, and a fourth reflection plate corresponding to the fourth sub pixel.

The first reflection plate may include a 1-1-th reflection plate overlapping most of the first sub pixel and a 1-2-th reflection plate overlapping a red light emitting diode of the first sub pixel, and the second reflection plate may include a 2-1-th reflection plate overlapping most of the second sub pixel and a 2-2-th reflection plate overlapping a red light emitting diode of the second sub pixel.

The third reflection plate may overlap entire third sub pixel, and the fourth reflection plate may overlap entire fourth sub pixel.

The plurality of first pad electrodes may be disposed in a first pad area adjacent to an upper edge of the first substrate and a second pad area adjacent to a lower edge of the first substrate.

The plurality of wiring lines may include a plurality of data lines extending from the first pad area to the plurality of pixel areas; and a plurality of gate driving lines extending from the first pad area to the plurality of gate driving areas.

The display device may further include a gate driver disposed in the plurality of gate driving areas. The plurality of gate driving lines may include a wiring line which transmits at least one of a clock signal, a start signal, a gate high voltage, and a gate low voltage to the gate driver.

The plurality of first pad electrodes may further include a plurality of high potential power pads which is disposed in the first pad area and is connected to the plurality of high potential power lines; and a plurality of low potential power pads which is disposed in the second pad area and is connected to the plurality of low potential power lines, and the plurality of data pads and the plurality of gate pads may be disposed in the first pad area.

A width of each of the gate pad, the high potential power pad and the low potential power pad may be greater than a width of the data pad.

The display device may further include a plurality of auxiliary high potential power lines which extends in a direction perpendicular to the plurality of high potential power lines and is electrically connected to the plurality of high potential power lines; and a plurality of auxiliary low potential power lines which extends in a direction perpendicular to the plurality of low potential power lines and is electrically connected to the plurality of low potential power lines.

One of the one pair of electrostatic discharge circuits may be disposed to be adjacent to the first pad area and the other of the one pair of electrostatic discharge circuits may be disposed to be adjacent to the second pad area.

One of the one pair of electrostatic discharge circuits may be connected to be adjacent to one end of each of the plurality of wiring lines and the other of the one pair of electrostatic discharge circuits may be connected to be adjacent to the other end of each of the plurality of wiring lines.

One of the one pair of electrostatic discharge circuits may be disposed to an auxiliary high potential power line adjacent to the first pad area, among the plurality of auxiliary high potential power lines, and the other of the one pair of electrostatic discharge circuits may be disposed to an auxiliary low potential power line adjacent to the second pad area, among the plurality of auxiliary low potential power lines.

The one pair of electrostatic discharge circuits may be disposed to be adjacent to any one of the first pad area and the second pad area.

Each of the one pair of electrostatic discharge circuits may include a protection transistor in which a protection source electrode and a protection drain electrode are connected between a first node and a second node; a first protection capacitor which is connected between the first node and a protection gate electrode of the protection transistor; and a second protection capacitor connected between the second node and the protection gate electrode, and any one of the first node and the second node may be electrically connected to the plurality of wiring lines and the other one may be electrically connected to any one of the plurality of high potential power lines and the plurality of low potential power lines.

The protection transistor may be configured with a structure in which a protection active layer is disposed on the first substrate, the protection gate electrode is disposed on the protection active layer, and the protection source electrode and the protection drain electrode are disposed on the protection gate electrode, the protection source electrode and the protection gate electrode at least may partially overlap to form the first protection capacitor, and the protection drain electrode and the protection gate electrode at least may partially overlap to form the second protection capacitor.

Each of the one pair of electrostatic discharge circuits may include a plurality of protection diodes connected in series.

Each of the plurality of protection diodes may include a protection active layer disposed on the first substrate; a protection gate electrode disposed on the protection active layer; a protection source electrode which is disposed on the protection gate electrode and is electrically connected to the protection active layer and the protection gate electrodes; and a protection drain electrode which is disposed on the protection gate electrode and is electrically connected to the protection active layer.

The display device may further include a plurality of transistors disposed in each of the plurality of pixel areas; and a plurality of gate driving transistors disposed in each of the plurality of gate driving areas.

The plurality of transistors of the plurality of pixel areas may include an active layer which is formed of semiconductor material and the plurality of gate driving transistors of the plurality of gate drivers may include an active layer which is formed of semiconductor material.

The active layer of the plurality of transistors of the plurality of pixel areas may be formed of any one of oxide semiconductor, amorphous silicon, and polysilicon, and the active layer of the plurality of gate driving transistors of the plurality of gate drivers may be formed of any one of oxide semiconductor, amorphous silicon, and polysilicon.

The active layers of the plurality of gate driving transistors of the gate driver may be formed of different materials.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. All the technical concepts in the equivalent scope of the present disclosure should be construed as falling within the scope of the present disclosure.

What is claimed is:

1. A display device, comprising:
    a first substrate in which a plurality of pixel areas and a plurality of gate driving areas are defined;
    a plurality of first pad electrodes that are on the first substrate, the plurality of first pad electrodes including a plurality of data pads, a plurality of gate pads, a plurality of high potential power pads and a plurality of low potential power pads;
    a plurality of wiring lines that are on the first substrate and are connected to the plurality of data pads and the plurality of gate pads;
    one pair of electrostatic discharge circuits connected to the plurality of wiring lines, respectively;
    a plurality of auxiliary high potential power lines that extend in a direction perpendicular to a plurality of high potential power lines, the plurality of auxiliary high potential power lines electrically connected to the plurality of high potential power lines; and
    a plurality of auxiliary low potential power lines that extend in a direction perpendicular to a plurality of low potential power lines, the plurality of auxiliary low potential power lines electrically connected to the plurality of low potential power lines,
    wherein one of the one pair of electrostatic discharge circuits is electrically connected to the plurality of high potential power lines and another of the one pair of electrostatic discharge circuits is electrically connected to the plurality of low potential power lines,
    wherein the plurality of first pad electrodes are in a first pad area adjacent to an upper edge of the first substrate and a second pad area adjacent to a lower edge of the first substrate,
    wherein the plurality of high potential power pads, the plurality of data pads and the plurality of gate pads are disposed in the first pad area, and the plurality of low potential power pads are disposed in the second pad area, and
    wherein the plurality of high potential power pads are connected to the plurality of high potential power lines and the plurality of low potential power pads are connected to the plurality of low potential power lines.

2. The display device according to claim 1, wherein the plurality of pixel areas include a first sub-pixel, a second sub-pixel, a third sub-pixel, and a fourth sub-pixel, and
    wherein the first sub-pixel and the second sub-pixel are configured to emit light with same color.

3. The display device according to claim 2, wherein one red light emitting diode is in each of the first sub-pixel and the second sub-pixel, respectively,
    wherein two green light emitting diodes are in the third sub-pixel, and
    wherein two blue light emitting diodes are in the fourth sub-pixel.

4. The display device according to claim 3, wherein each of the red light emitting diodes is connected to one driving transistor of each of the first sub-pixel and the second sub-pixel to be individually driven,
    wherein the two green light emitting diodes of the third sub-pixel are connected to one driving transistor of the third sub-pixel in parallel to be driven in common, and
    wherein the two blue light emitting diodes of the fourth sub-pixel are connected to one driving transistor of the fourth sub-pixel in parallel to be driven in common.

5. The display device according to claim 2, further comprising:
    a first reflection plate corresponding to the first sub-pixel, a second reflection plate corresponding to the second sub-pixel, a third reflection plate corresponding to the third sub-pixel, and a fourth reflection plate corresponding to the fourth sub-pixel.

6. The display device according to claim 5, wherein the first reflection plate includes a 1-1-th reflection plate overlapping most of the first sub-pixel and a 1-2-th reflection plate overlapping a red light emitting diode of the first sub-pixel, and
    wherein the second reflection plate includes a 2-1-th reflection plate overlapping most of the second sub-pixel and a 2-2-th reflection plate overlapping a red light emitting diode of the second sub-pixel.

7. The display device according to claim 6, wherein the third reflection plate overlaps the third sub-pixel in its entirety, and the fourth reflection plate overlaps the fourth sub-pixel in its entirety.

8. The display device according to claim 1, wherein the plurality of wiring lines include:
    a plurality of data lines extending from the first pad area to the plurality of pixel areas; and a plurality of gate driving lines extending from the first pad area to the plurality of gate driving areas.

9. The display device according to claim 8, further comprising:

a gate driver in the plurality of gate driving areas, wherein the plurality of gate driving lines include a wiring line that transmits at least one of a clock signal, a start signal, a gate high voltage, or a gate low voltage to the gate driver.

10. The display device according to claim 1, wherein a width of each of a gate pad of the plurality of gate pads, a high potential power pad of the plurality of high potential power pads, and a low potential power pad of the plurality of low potential power pads is greater than a width of a data pad from the plurality of data pads.

11. The display device according to claim 1, wherein one of the one pair of electrostatic discharge circuits is adjacent to the first pad area and the other of the one pair of electrostatic discharge circuits is adjacent to the second pad area.

12. The display device according to claim 11, wherein one of the one pair of electrostatic discharge circuits is adjacent to one end of each of the plurality of wiring lines and the other of the one pair of electrostatic discharge circuits is adjacent to another end of each of the plurality of wiring lines.

13. The display device according to claim 11, wherein one of the one pair of electrostatic discharge circuits is connected to an auxiliary high potential power line adjacent to the first pad area, among the plurality of auxiliary high potential power lines, and another of the one pair of electrostatic discharge circuits is connected to an auxiliary low potential power line adjacent to the second pad area, among the plurality of auxiliary low potential power lines.

14. The display device according to claim 1, wherein the one pair of electrostatic discharge circuits is adjacent to any one of the first pad area and the second pad area.

15. The display device according to claim 1, wherein each of the one pair of electrostatic discharge circuits includes:

a protection transistor including a protection source electrode and a protection drain electrode are connected between a first node and a second node;

a first protection capacitor that is connected between the first node and a protection gate electrode of the protection transistor; and a second protection capacitor connected between the second node and the protection gate electrode, and wherein any one of the first node and the second node is electrically connected to the plurality of wiring lines and the other of the first node and the second node is electrically connected to any one of the plurality of high potential power lines and the plurality of low potential power lines.

16. The display device according to claim 15, wherein the protection transistor is configured with a structure in which a protection active layer is on the first substrate, the protection gate electrode is on the protection active layer, and the protection source electrode and the protection drain electrode are on the protection gate electrode, the protection source electrode and the protection gate electrode at least partially overlap and form the first protection capacitor, and the protection drain electrode and the protection gate electrode at least partially overlap and form the second protection capacitor.

17. The display device according to claim 1, wherein each of the one pair of electrostatic discharge circuits includes a plurality of protection diodes connected in series.

18. The display device according to claim 17, wherein each of the plurality of protection diodes includes:

a protection active layer on the first substrate;

a protection gate electrode on the protection active layer;

a protection source electrode on the protection gate electrode, the protection source electrode electrically connected to the protection active layer and the protection gate electrode; and a protection drain electrode on the protection gate electrode, the protection drain electrode electrically connected to the protection active layer.

19. The display device according to claim 1, further comprising:

a plurality of transistors in each of the plurality of pixel areas; and a plurality of gate driving transistors in each of the plurality of gate driving areas.

20. The display device according to claim 19, wherein the plurality of transistors of the plurality of pixel areas include an active layer comprising semiconductor material, and wherein the plurality of gate driving transistors of the plurality of gate driving areas include an active layer comprising semiconductor material.

21. The display device according to claim 20, wherein the active layer of the plurality of transistors of the plurality of pixel areas includes any one of oxide semiconductor, amorphous silicon, or polysilicon, and wherein the active layer of the plurality of gate driving transistors of the plurality of gate driving areas includes any one of oxide semiconductor, amorphous silicon, or polysilicon.

22. The display device according to claim 21, wherein active layers of the plurality of gate driving transistors of the plurality of gate driving areas include different materials.

\* \* \* \* \*